(12) United States Patent
Sano

(10) Patent No.: US 11,924,967 B2
(45) Date of Patent: Mar. 5, 2024

(54) SUBSTRATE, ELECTRONIC CIRCUIT, ANTENNA APPARATUS, ELECTRONIC APPARATUS, AND METHOD FOR PRODUCING A SUBSTRATE

(71) Applicant: Kabushiki Kaisha Toshiba, Tokyo (JP)

(72) Inventor: Makoto Sano, Ota Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 311 days.

(21) Appl. No.: 17/447,172

(22) Filed: Sep. 8, 2021

(65) Prior Publication Data
US 2022/0272835 A1    Aug. 25, 2022

(30) Foreign Application Priority Data
Feb. 22, 2021   (JP) .................. 2021-026317

(51) Int. Cl.
*H01Q 1/38*   (2006.01)
*H05K 1/02*   (2006.01)
(Continued)

(52) U.S. Cl.
CPC .......... *H05K 1/0251* (2013.01); *H05K 1/115* (2013.01); *H05K 3/366* (2013.01); *H05K 2201/10098* (2013.01)

(58) Field of Classification Search
CPC .. H01Q 1/22; H01Q 1/38; H01Q 1/48; H01Q 21/00; H01Q 21/06; H01Q 13/08;
(Continued)

(56) References Cited

U.S. PATENT DOCUMENTS 6,233,820 B1   5/2001   Hummelink
7,804,695 B2 *   9/2010   Thevenard ............... H01Q 1/38
                                                                  174/262

(Continued)

FOREIGN PATENT DOCUMENTS

JP   2008-262989 A   10/2008
JP   2016-72818 A   5/2016
(Continued)

*Primary Examiner* — Tho G Phan
(74) *Attorney, Agent, or Firm* — Finnegan, Henderson, Farabow, Garrett & Dunner, LLP

(57) ABSTRACT

According to one embodiment, a substrate includes a first dielectric substrate with a first through-hole, a second dielectric substrate with a first conductive via, a first signal line provided between the first dielectric substrate and the second dielectric substrate, a third dielectric substrate with a second conductive via, a first planar conductor provided between the second and third dielectric substrates and located away from the first and second conductive vias, a fourth dielectric substrate, and a second signal line provided between the third and fourth dielectric substrates. At least a part of a first inner wall of the first through-hole is not covered with a conductor. The first through-hole and the first conductive via partially overlap in a first direction. The first and second conductive vias partially overlap in the first direction. The second conductive via and the second signal line partially overlap in the first direction.

20 Claims, 31 Drawing Sheets

(51) Int. Cl.
*H05K 1/11* (2006.01)
*H05K 3/36* (2006.01)

(58) Field of Classification Search
CPC .......... H05K 1/02; H05K 1/0251; H05K 1/11; H05K 1/115; H05K 1/116; H05K 1/18; H05K 2201/10098; H05K 3/10; H05K 3/18; H05K 3/366; H05K 3/4623
See application file for complete search history.

(56) References Cited

U.S. PATENT DOCUMENTS

| | | | |
|---|---|---|---|
| 7,940,218 B2 * | 5/2011 | Jansen | H01Q 1/38 |
| | | | 343/702 |
| 8,164,005 B2 | 4/2012 | Yamashita et al. | |
| 8,816,927 B2 * | 8/2014 | Nakano | H01Q 1/2266 |
| | | | 343/702 |
| 10,566,702 B2 | 2/2020 | Hashimoto | |
| 10,856,408 B1 * | 12/2020 | Leung | H01P 1/2002 |
| 11,018,404 B2 | 5/2021 | Amano | |
| 11,064,602 B1 * | 7/2021 | Wolf | H05K 3/368 |
| 11,831,060 B2 | 11/2023 | Sakurai et al. | |
| 2021/0038909 A1 | 2/2021 | Yoshino | |

FOREIGN PATENT DOCUMENTS

| | | |
|---|---|---|
| JP | 2017-45847 A | 3/2017 |
| JP | 6222747 B2 | 11/2017 |
| JP | 2019-41213 A | 3/2019 |
| JP | 2019-165406 A | 9/2019 |
| WO | WO 2019/207930 A1 | 10/2019 |
| WO | WO 2019/220530 A1 | 11/2019 |

\* cited by examiner

SUBSTRATE, ELECTRONIC CIRCUIT, ANTENNA APPARATUS, ELECTRONIC APPARATUS, AND METHOD FOR PRODUCING A SUBSTRATE

CROSS-REFERENCE TO RELATED APPLICATION (S)

This application is based upon and claims the benefit of priority from Japanese Patent Application No. 2021-026317, filed Feb. 22, 2021; the entire contents of which are incorporated herein by reference.

FIELD

Embodiments described herein relate generally to a substrate, an electronic circuit, an antenna apparatus, an electronic apparatus, and a method for producing a substrate.

BACKGROUND

As a method for propagating a high-frequency signal between signal lines formed in a mufti-layer substrate, a method using a conductive via (i.e., a through-hole) penetrating the substrate is known. However, there is a case where a signal line and a conductive via in a layer on the outer side of the signal line are electrically connected, or a high-frequency signal is partially propagated to the conductive via in the layer on the outer side from the signal line. In such a case, there is a possibility that the conductive via in the layer on the outer side may act as a stub to deteriorate transmission properties for high-frequency signals. If such a conductive via is not formed in the layer on the outer side, nor is a through-hole provided, air may remain in a conductive via in a layer on the inner side of the signal line. In such a case, the atmospheric pressure of the remaining air may fluctuate due to a change in the atmospheric pressure or temperature, which in turn may generate stress that would peel or tightly press some of the layers forming the substrate, and thus may decrease the long-term reliability of the substrate.

DETAILED DESCRIPTION

Figure 1A:
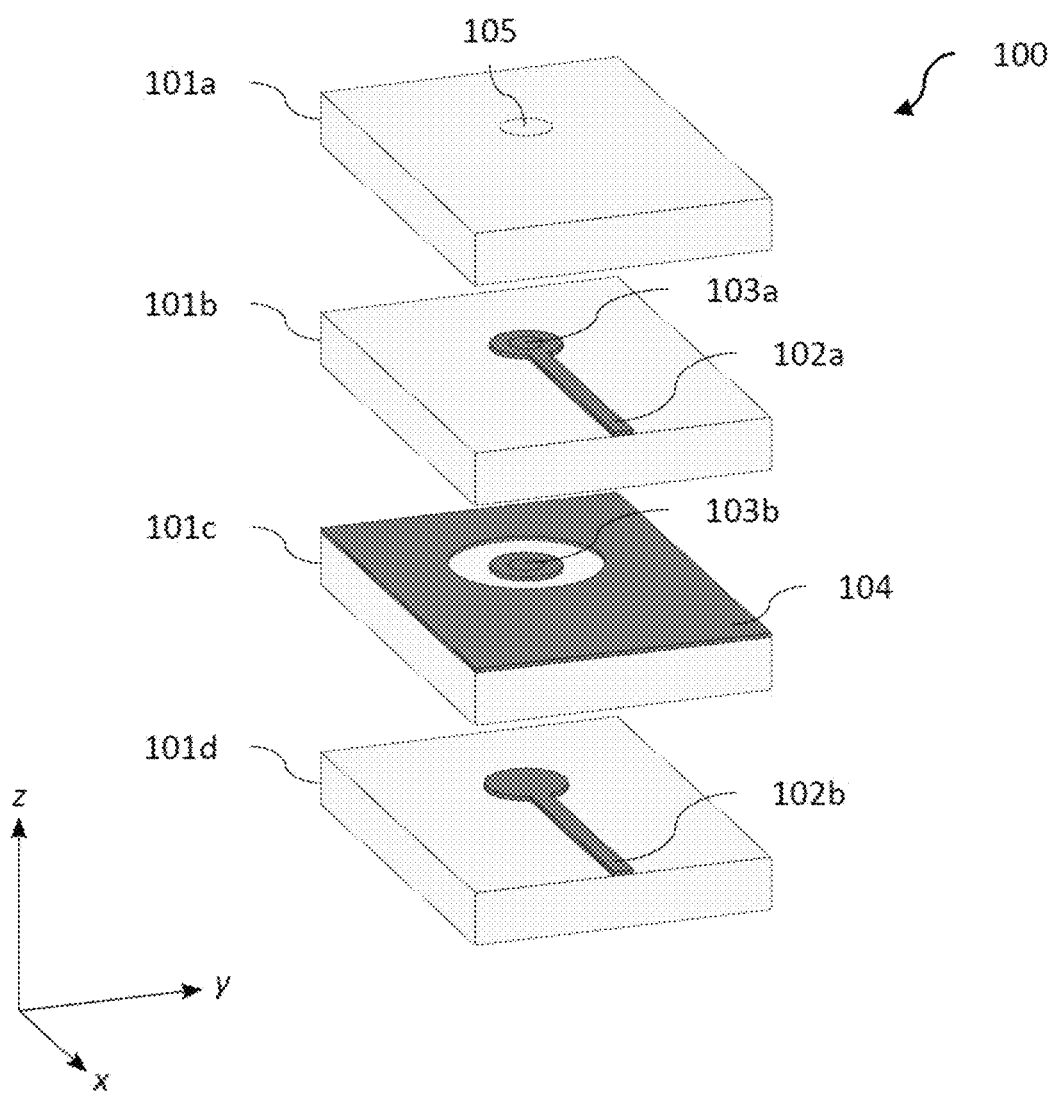
FIG. 1A is a stereoscopic view of a substrate 100 according to a first embodiment.

According to one embodiment, a substrate includes a first dielectric substrate including a first face, a second face, and a first through-hole penetrating the first dielectric substrate from the first face to the second face; a second dielectric substrate including a third face, a fourth face, and a first conductive via penetrating the second dielectric substrate from the third face to the fourth face; a first signal line provided between the first dielectric substrate and the second dielectric substrate; a third dielectric substrate including a fifth face, a sixth face, and a second conductive via penetrating the third dielectric substrate from the fifth face to the sixth face; a first planar conductor provided between the second dielectric substrate and the third dielectric substrate, the first planar conductor being located away from the first conductive via and the second conductive via; a fourth dielectric substrate; and a second signal line provided between the third dielectric substrate and the fourth dielectric substrate, in which at least a part of a first inner wall of the first dielectric substrate at a portion where the first through-hole is provided is not covered with a conductor, the first through-hole and the first conductive via at least partially overlap in a first direction in which at least one of the first conductive via and the second conductive via penetrate, the first conductive via and the second conductive via at least partially overlap in the first direction, and the second conductive via and the second signal line at least partially overlap in the first direction.

An embodiment will be explained in detail below with reference to the accompanying drawings. The present invention is not limited to the embodiment.

Hereinafter, embodiments for implementing the invention will be described with reference to the drawings. The disclosure is only exemplary, and the invention is not limited by the following descriptions of the embodiments. Modifications that one of the ordinary skill in the art would easily arrive at are naturally encompassed by the scope of the disclosure. Throughout the drawings, each portion may be schematically illustrated with its size, shape, and the like changed from those in the actual embodiments for clarification purposes. In the plurality of drawings, corresponding elements are be denoted by the same reference numeral, and detailed description thereof may be omitted.

First Embodiment

Figure 1B:
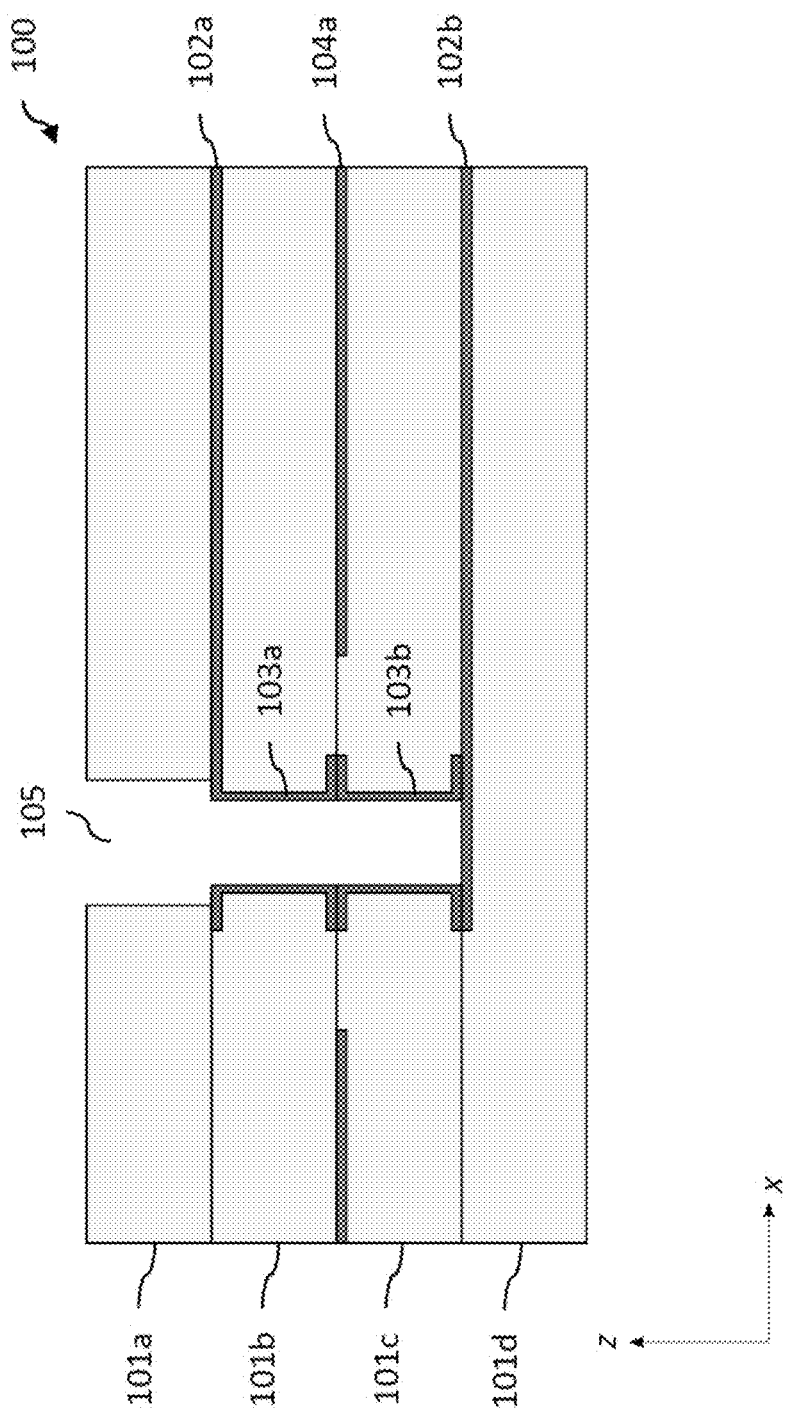
FIG. 1B is an xz cross-sectional view of the substrate 100 according to the first embodiment.

FIG. 1A is a stereoscopic view of a substrate 100 according to a first embodiment. The substrate 100 includes dielectric substrates 101a, 101b, 101c, and 101d, signal lines 102a and 102b, conductive vias 103a and 103b, and a planar conductor 104. The dielectric substrate 101a has a through-hole 105 formed therein. The substrate 100 is formed by individually forming the plurality of dielectric substrates and stacking them. For visibility purposes, FIG. 1A illustrates the substrate 100 before its individual layers are stacked, with gaps provided between the dielectric substrates 101a to 101d. In the drawing, the direction in which the dielectric substrates 101a to 101d are stacked is represented by the z-direction. FIG. 1B is an xz cross-sectional view of the substrate 100 after its individual layers are stacked. The xz cross-sectional view represents an example of an xz cross-sectional view passing through the through-hole 105. It should be noted that the substrate 100 may also be referred to as a multi-layer substrate.

The substrate 100 propagates high-frequency signals. A high-frequency signal input to the signal line 102a or 102b is output from the signal line 102b or 102a via the conductive vias 103a and 103b. The high-frequency signal is a signal with a frequency band used for wireless communication, RFID, or the Ku band for satellite communication, for example, and represents a signal with a frequency of hundreds of MHz, for example.

The dielectric substrates 101a to 101d are insulating dielectric substrates. Examples of the materials of the dielectric substrates 101a to 101d include PTFE (polytetrafluoroethylene), PPE (poly phenylene ether), a foam resin, liquid crystal polymers, COP (cycloolefin polymers), glass epoxy, LTCC (low-temperature co-fired ceramics), paper phenol, MgO (magnesium oxide), and glass. A composite material obtained by mixing PTFE with ceramic fillers or glass cloth may also be used. The base materials and thicknesses of the dielectric substrates 101a to 101d may be either the same or different. The surface of each of the dielectric substrates 101a to 101d may be coated with a protective layer of solder resist, for example. The dielectric substrates 101a to 101d may be fixed together with a screw or a clamp after being stacked. When the base material of each of the dielectric substrates 101a to 101d is thermoplastic like PTFE, the dielectric substrates 101a to 101d may be joined by heating and pressurization.

It should be noted that the dielectric substrate 101a may also be referred to as a first dielectric substrate, the dielectric substrate 101b may also be referred to as a second dielectric substrate, the dielectric substrate 101c may also be referred to as a third dielectric substrate, and the dielectric substrate 101d may also be referred to as a fourth dielectric substrate. A face of the dielectric substrate 101a parallel with the xy plane in the +z-direction is referred to as a face a1. A face of the dielectric substrate 101a parallel with the xy plane in the −z-direction is referred to as a face a2. A face of the dielectric substrate 101b parallel with the xy plane in the +z-direction is referred to as a face b1. A face of the dielectric substrate 101b parallel with the xy plane in the −z-direction is referred to as a face b2. A face of the dielectric substrate 101c parallel with the xy plane in the +z-direction is referred to as a face c1. A face of the dielectric substrate 101c parallel with the xy plane in the −z-direction is referred to as a face c2. A face of the dielectric substrate 101d parallel with the xy plane in the +z-direction is referred to as a face d1. A face of the dielectric substrate 101d parallel with the xy plane in the −z-direction is referred to as a face d2. The face a1 may also be referred to as a first face. The face a2 may also be referred to as a second face. The face b1 may also be referred to as a third face. The face b2 may also be referred to as a fourth face. The face c1 may also be referred to as a fifth face. The face c2 may also be referred to as a sixth face. The face d1 may also be referred to as a seventh face. The face d2 may also be referred to as an eighth face.

The signal lines 102a and 102b propagate high-frequency signals. That is, the signal lines 102a and 102b are signal lines, one of which is adapted to propagate a high-frequency signal to the other signal line. The signal line 102a is provided between the dielectric substrates 101a and 101b. The signal line 102b is provided between the dielectric substrates 101c and 101d. FIG. 1A illustrates an example in which the signal line 102a is provided on the face b1 of the dielectric substrate 101b, and the signal line 102b is provided on the face d1 of the dielectric substrate 101d. The material of each of the signal lines 102a and 102b is copper, nickel, gold, or silver, for example. Each of the surfaces of the signal lines 102a and 102b may be plated with a different type of conductor, or be coated with solder resist, flux, or solder leveler, for example. The materials and shapes of the signal lines 102a and 102b may be either the same or different. In addition, each of the signal lines 102a and 102b may have connected thereto an impedance matching element, such as a stub or a step structure. It should be noted that the signal line 102a may also be referred to as a first signal line, and the signal line 102b may also be referred to as a second signal line.

The conductive vias 103a and 103b propagate a high-frequency signal from one of the signal lines 102a and 102b to the other signal line. That is, a high-frequency signal input to one of the signal lines 102a and 102b is propagated to the other signal line through the conductive vias 103a and 103b. The conductive via 103a is provided penetrating the dielectric substrate 101b from its face b1 to face b2, and the conductive via 103b is provided penetrating the dielectric substrate 101c from its face c1 to face c2. It should be noted that the conductive via 103a may also be referred to as a first conductive via, and the conductive via 103b may also be referred to as a second conductive via. Although the conductive vias 103a and 103b are each represented in a cylindrical shape in FIG. 1A, the conductive vias 103a and 103b may have any other shapes, such as an elliptical shape, a rectangular shape, or a shape at least partially including a curve.

The signal line 102a and the conductive via 103a are electrically connected, or are provided at a distance therebetween that allows a high-frequency signal to be propagated due to capacitance. The conductive via 103a and the through-hole 105 at least partially overlap in the penetrating direction of at least one of the conductive vias 103a and 103b (i.e., the z-direction in the present embodiment). Hereinafter, the penetrating direction of at least one of the conductive vias 103a and 103b may also be referred to as a first direction. The conductive vias 103a and 103b at least partially overlap in the first direction. In addition, the conductive via 103b and the signal line 102b at least partially overlap in the first direction. Accordingly, a space in the through-hole 105, a space in the conductive via 103a, and a space in the conductive via 103b are connected (i.e., serve as an air passage). Thus, even when the temperature or atmospheric pressure outside of the substrate 100 has changed, the atmospheric pressure of air in such spaces and the atmospheric pressure outside of the substrate 100 are allowed to be at about the same level. Thus, stress that would peel or tightly press some of the layers (i.e., the dielectric substrates) forming the substrate 100 can be reduced. Consequently, the long-term reliability of the substrate 100 improves.

The planar conductor 104a forms a microstrip line together with the signal lines 102a and 102b. The planar conductor 104a is provided between the dielectric substrate 101b and the dielectric substrate 101c. FIG. 1A illustrates an example in which the planar conductor 104a is provided on the face c1 of the dielectric substrate 101c. The material of the planar conductor 104a is a conductor, such as copper, nickel, gold, or silver. The surface of the planar conductor 104a may be plated with a different type of conductor. Alternatively, the surface of the planar conductor 104a may be coated with solder resist, flux, or solder leveler, for example. The area of the planar conductor 104a is larger than the area of the signal line 102a. In addition, the area of the planar conductor 104a is larger than the area of the signal line 102b. It should be noted that the planar conductor 104a may also be referred to as a first planar conductor 104a.

The conductive vias 103a and 103b and the planar conductor 104a are located away from each other and are not electrically connected. The signal line 102a and the planar conductor 104a form a microstrip line. Similarly, the signal line 102b and the planar conductor 104a form a microstrip line. It should be noted that a conductor pattern (not illustrated) may be added around the signal line 102a or 102b to form a coplanar line or a fin line.

The through-hole 105 is provided penetrating the dielectric substrate 101a from its face a1 to face a2. The through-hole 105 may be formed by any method, and is formed using a drill or a laser, for example. Although the through-hole 105 is represented in a cylindrical shape in FIG. 1A, the through-hole 105 may have any other shapes, such as an elliptical shape, a rectangular shape, or a shape at least partially including a curve. In addition, the through-hole 105 may be provided with a vent.

At least a part of the inner wall of the through-hole 105, that is, at least a part of a portion of the dielectric substrate 101a with the through-hole 105 is not covered with a conductor. More specifically, a portion of the inner wall of the through-hole 105 within a predetermined distance from the signal line 102a in the first direction is not covered with a conductor. The predetermined distance is determined based on at least one of the diameter of the through-hole 105, the diameter of the conductive via 103a, and the width of the signal line 102a. Accordingly, the possibility that a high-frequency signal may be propagated to a part of the dielectric substrate 101a can be reduced, and thus, the possibility that the through-hole 105 may act as a stub can be reduced. Consequently, deterioration of transmission properties for high-frequency signals can be reduced. It should be noted that the through-hole 105 may also be referred to as a first through-hole, and the inner wall of the through-hole 105 may also be referred to as a first inner wall.

The components of the substrate 100 have been described above. The present embodiment is only exemplary, and thus can be modified in a variety of ways. Hereinafter, modified examples applicable to the present embodiment will be described. Hereinafter, components same as those of the present embodiment will be denoted by the same reference numerals, and description thereof will be omitted.

Modified Example 1

The substrate 100 is produced by stacking the dielectric substrates 101a to 101d. The dielectric substrates 101a to 101d are produced individually. Referring to FIG. 1A as an example, the substrate 100 is produced by stacking the dielectric substrate 101a having the through-hole 105, the dielectric substrate 101b having the signal line 102a and the conductive via 103a, the dielectric substrate 101c having the planar conductor 104a and the conductive via 103b, and the dielectric substrate 101d having the signal line 102b in this order in the +z-direction. In the production of the dielectric substrate 101b, the signal line 102a may be formed on the face b1. In production of the dielectric substrate 101c, the planar conductor 104a may be formed on the face c1. In the production of the dielectric substrate 101d, the signal line 102b may be formed on the face d1.

Modified Example 2

Figure 2A:
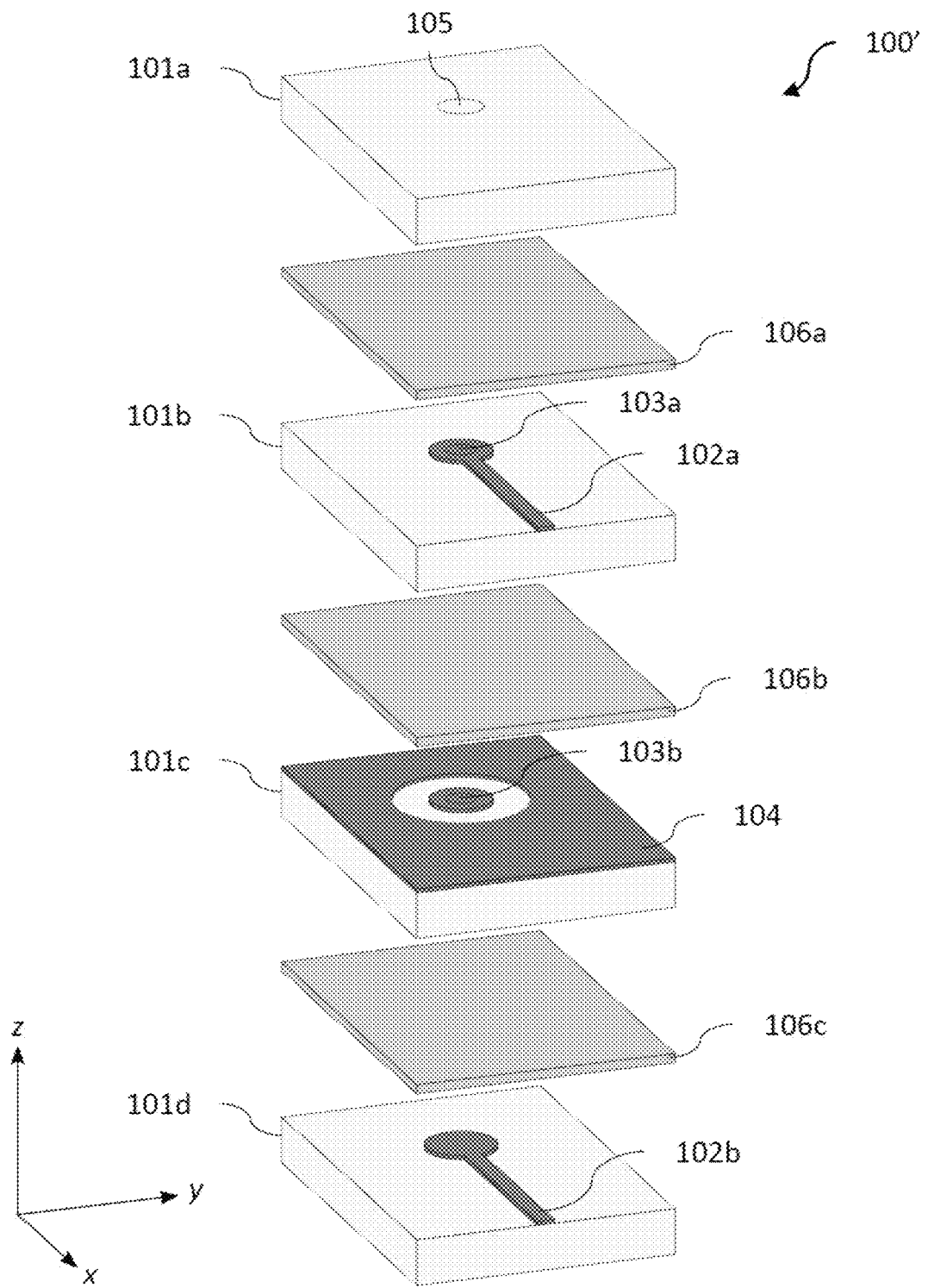
FIG. 2A is a stereoscopic view of a substrate 100' applicable to the first embodiment.
Figure 2B:
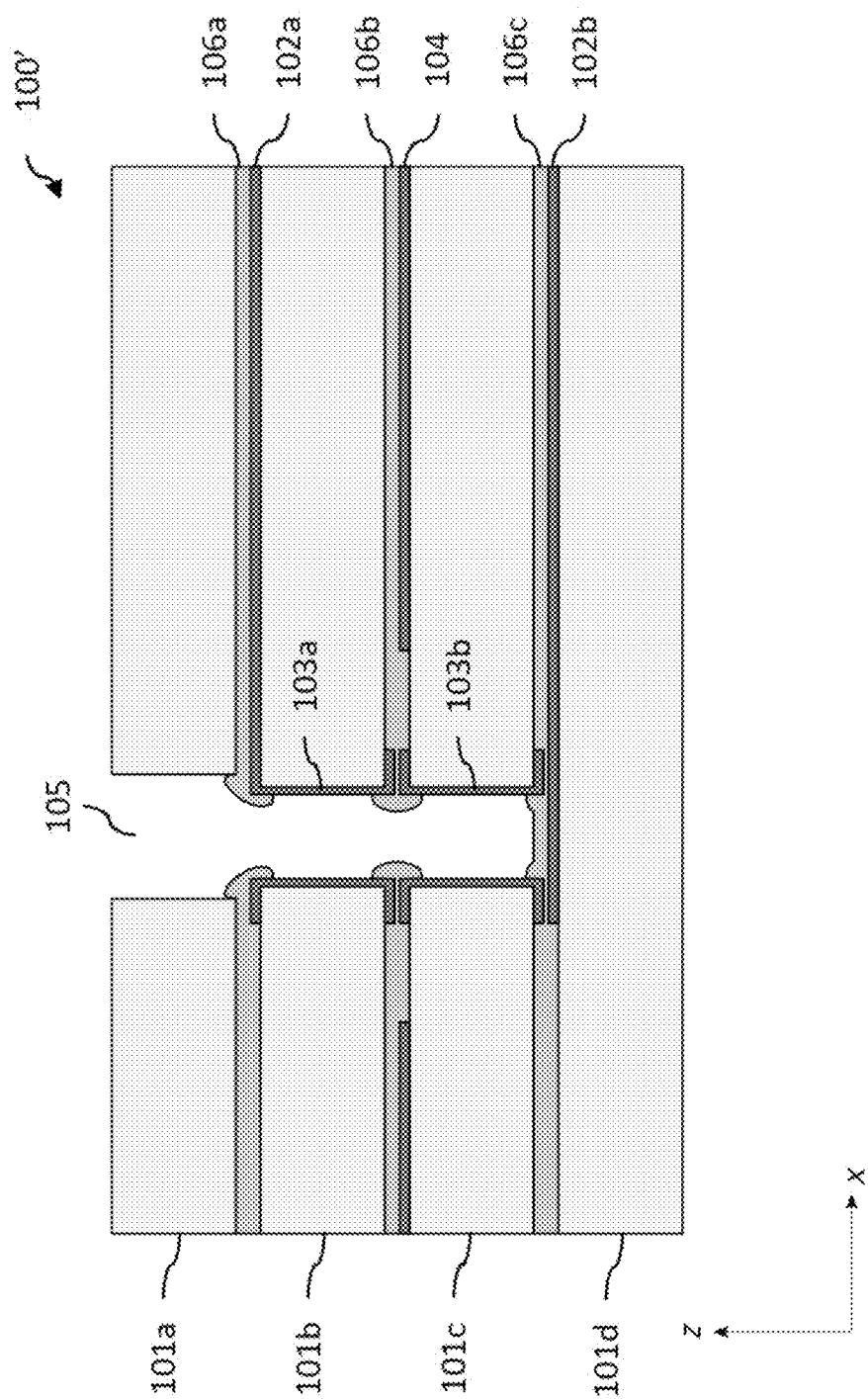
FIG. 2B is an xz cross-sectional view of the substrate 100 applicable to the first embodiment.

FIG. 2A is a stereoscopic view of a substrate 100' according to Modified Example 2. The substrate 100' is formed by stacking the dielectric substrates 101a to 101d and joining them with bonding layers. A bonding layer 106a is provided between the dielectric substrates 101a and 101b, and thus joins the dielectric substrates 101a and 101b. A bonding layer 106b is provided between the dielectric substrates 101b and 101c, and thus joins the dielectric substrates 101b and 101c. A bonding layer 106c is provided between the dielectric substrates 101c and 101d, and thus joins the dielectric substrates 101c and 101d. For visibility purposes, FIG. 2A illustrates the substrate 100' before its individual layers are stacked, with gaps provided between the dielectric substrates 101a to 101d. FIG. 2B is an xz cross-sectional view of the substrate 100' after its individual layers are stacked.

Each of the bonding layers 106a to 106c is an insulator that joins an adjacent pair of dielectric substrates, and may be a bonding film or a prepreg, for example. At least one of the bonding layers 106a to 106c may include a plurality of bonding layers. For example, the bonding layer 106a may include two bonding layers. It should be noted that the bonding layer 106a may also be referred to as a first bonding layer, the bonding layer 106b may also be referred to as a second bonding layer, and the bonding layer 106c may also be referred to as a third bonding layer.

In the substrate 100', the conductive vias 103a and 103b may not be electrically connected due to the presence of the bonding layer 106b, and the conductive via 103b and the signal line 102b may not be electrically connected due to the presence of the bonding layer 106c. In such cases, a DC signal is not propagated. However, a high-frequency signal can be propagated due to capacitance between the conductive vias 103a and 103b and capacitance between the conductive via 103b and the signal line 102b. It should be noted that capacitance can be increased by increasing the areas of the conductors facing each other with the bonding layer interposed therebetween and by reducing the thickness of the bonding layer, for example. For example, capacitance can be increased by increasing the areas of lands of the conductive vias 103 facing each other, increasing the areas of the signal lines 102, and reducing the thickness of the bonding layers 106 in the first direction. Increasing the capacitance can improve transmission properties for high-frequency signals.

Referring to FIG. 2A, in the substrate 100' before its individual layers are stacked, the bonding layers 106a and 106b have no holes corresponding to the through-hole 105 and the conductive vias 103a and 103b, respectively. However, when a heating and pressurization step is performed in stacking the dielectric substrates 101a to 101d, portions of the bonding layers 106a and 106b corresponding to the through-hole 105 and the conductive vias 103a and 103b, respectively, flow into the through-hole 105 and the conductive vias 103a and 103b. Consequently, the bonding layers 106a and 106b are provided with holes corresponding to the through-hole 105 and the conductive vias 103a and 103b, respectively.

Figure 2C:
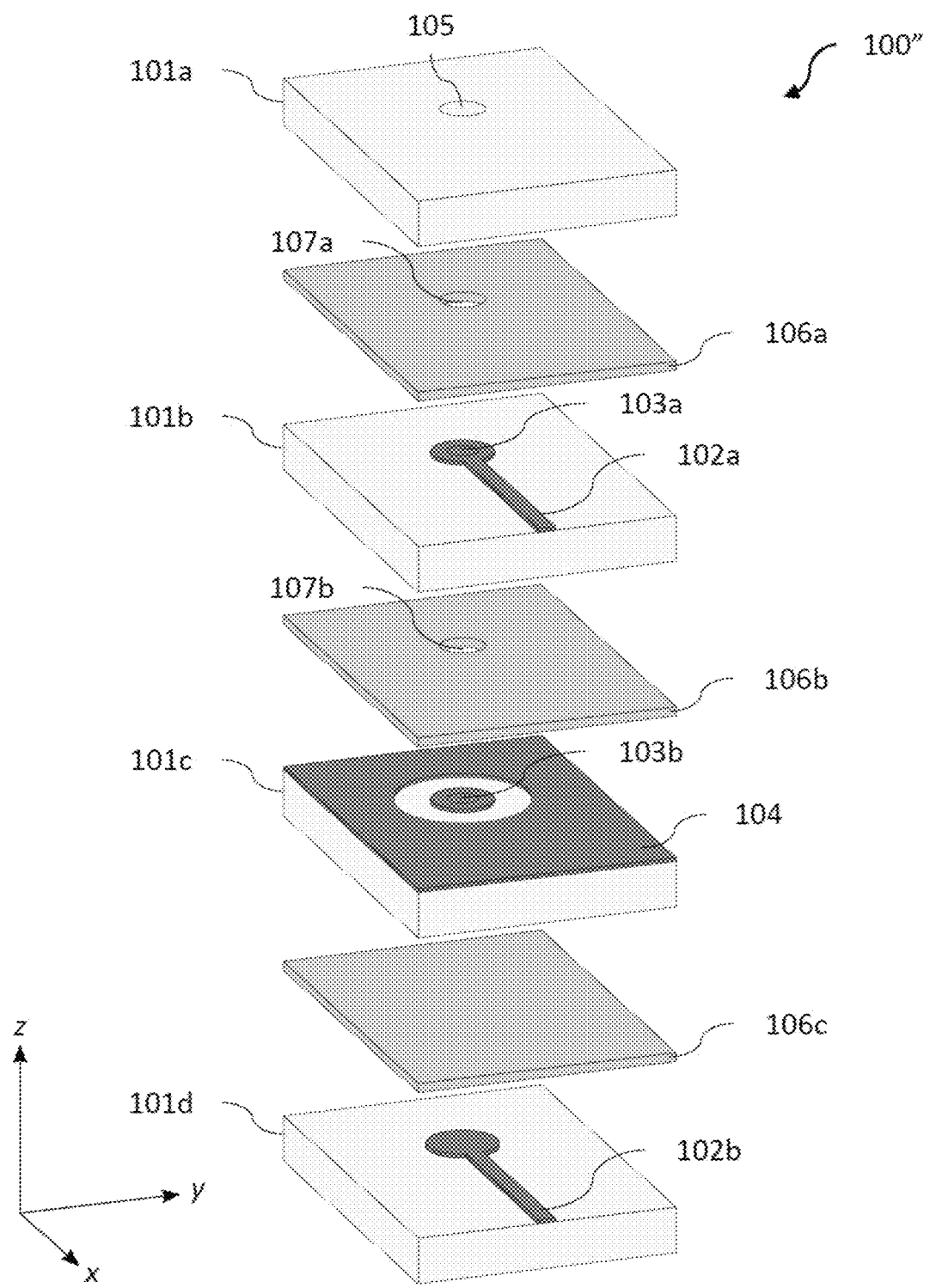
FIG. 2C is a stereoscopic view of a substrate 100" applicable to the first embodiment.

FIG. 2C is a stereoscopic view of a substrate 100'' when the bonding layers 106a and 106b are provided with holes before the individual layers are stacked. The bonding layers 106a and 106b may be provided with holes corresponding to the through-hole 105 and the conductive vias 103a and 103b, respectively, before the individual layers are stacked. For the substrate 100' also, the bonding layers 106a and 106b may be provided with holes corresponding to the through-hole 105 and the conductive vias 103a and 103b, respectively, after the individual layers are stacked.

As described above, according to Modified Example 2, the dielectric substrates 101a to 101d can be joined with the bonding layers 106a to 106c.

Modified Example 3

Figure 3:
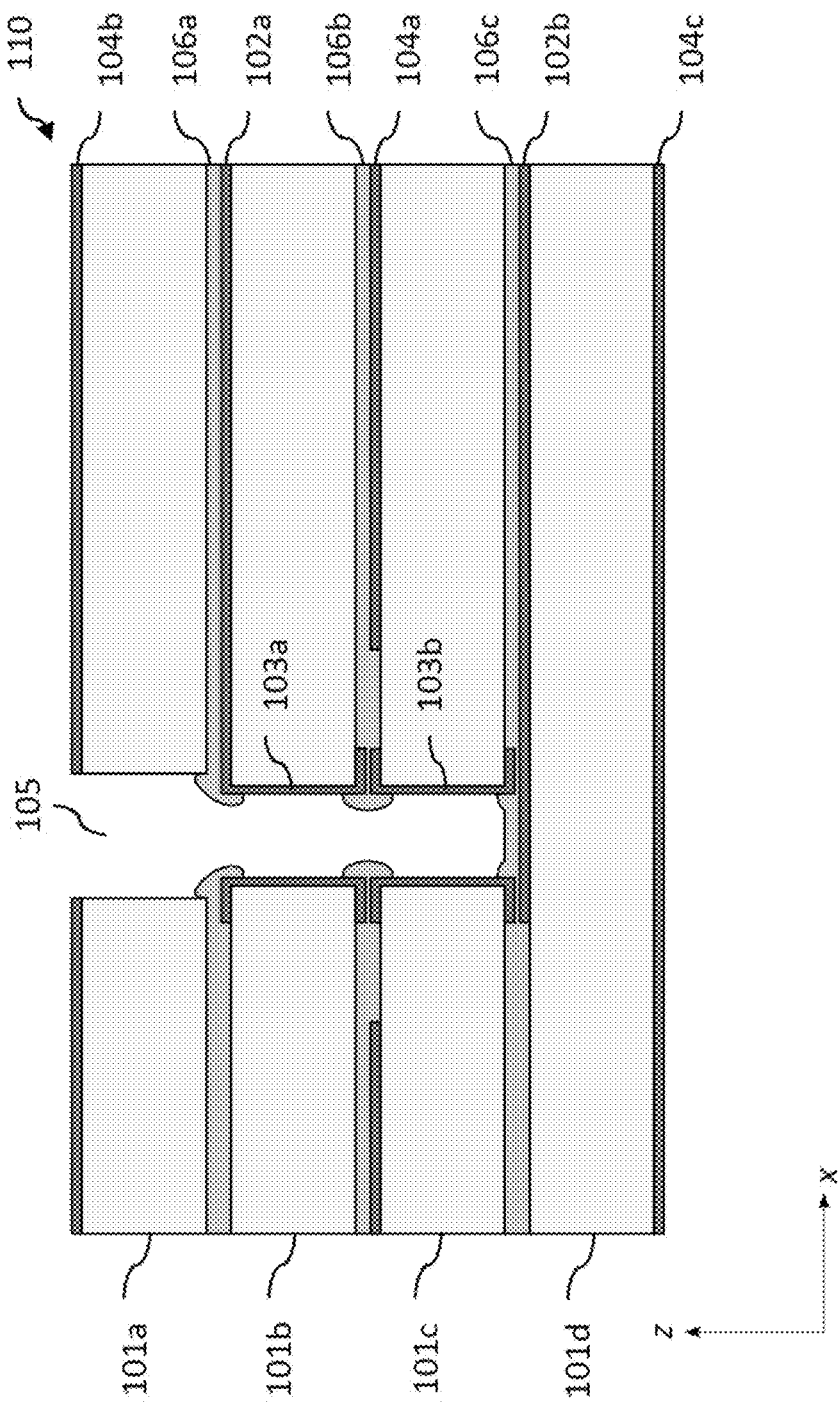
FIG. 3 is an xz cross-sectional view of a substrate 110 applicable to the first embodiment.

FIG. 3 is an xz cross-sectional view of a substrate 110 according to Modified Example 3. The substrate 110 further includes planar conductors 104b and 104c in addition to the components of the substrate 100'. The signal line 102a is provided between the planar conductors 104b and 104a, and the signal line 102b is provided between the planar conductors 104a and 104c, FIG. 3 illustrates an example in which the planar conductor 104b is provided on the face a1 of the dielectric substrate 101a, and the planar conductor 104c is provided on the face d2 of the dielectric substrate 101d. It should be noted that the planar conductor 104b may also be referred to as a second planar conductor, and the planar conductor 104c may also be referred to as a third planar conductor.

For the planar conductors 104b and 104c, a conductor described with reference to the planar conductor 104a is applicable. At least one of the planar conductors 104a, 104b, and 104c may be a different conductor. In addition, all of the planar conductors 104a, 104b, and 104c may have the same shape, or at least one of them may have a different shape. The area of the planar conductor 104b is larger than the area of the signal line 102a, and the area of the planar conductor 104c is larger than the area of the signal line 102b. Accordingly, the planar conductor 104b, the signal line 102a, and the planar conductor 104a form a strip line. Similarly, the planar conductor 104a, the signal line 102b, and the planar conductor 104c form a strip line. This can suppress radiation of a high-frequency signal from the signal lines 102a and 102b to the outside of the substrate 110. Consequently, deterioration of transmission properties for high-frequency signals can be reduced.

Modified Example 4

Figure 4A:
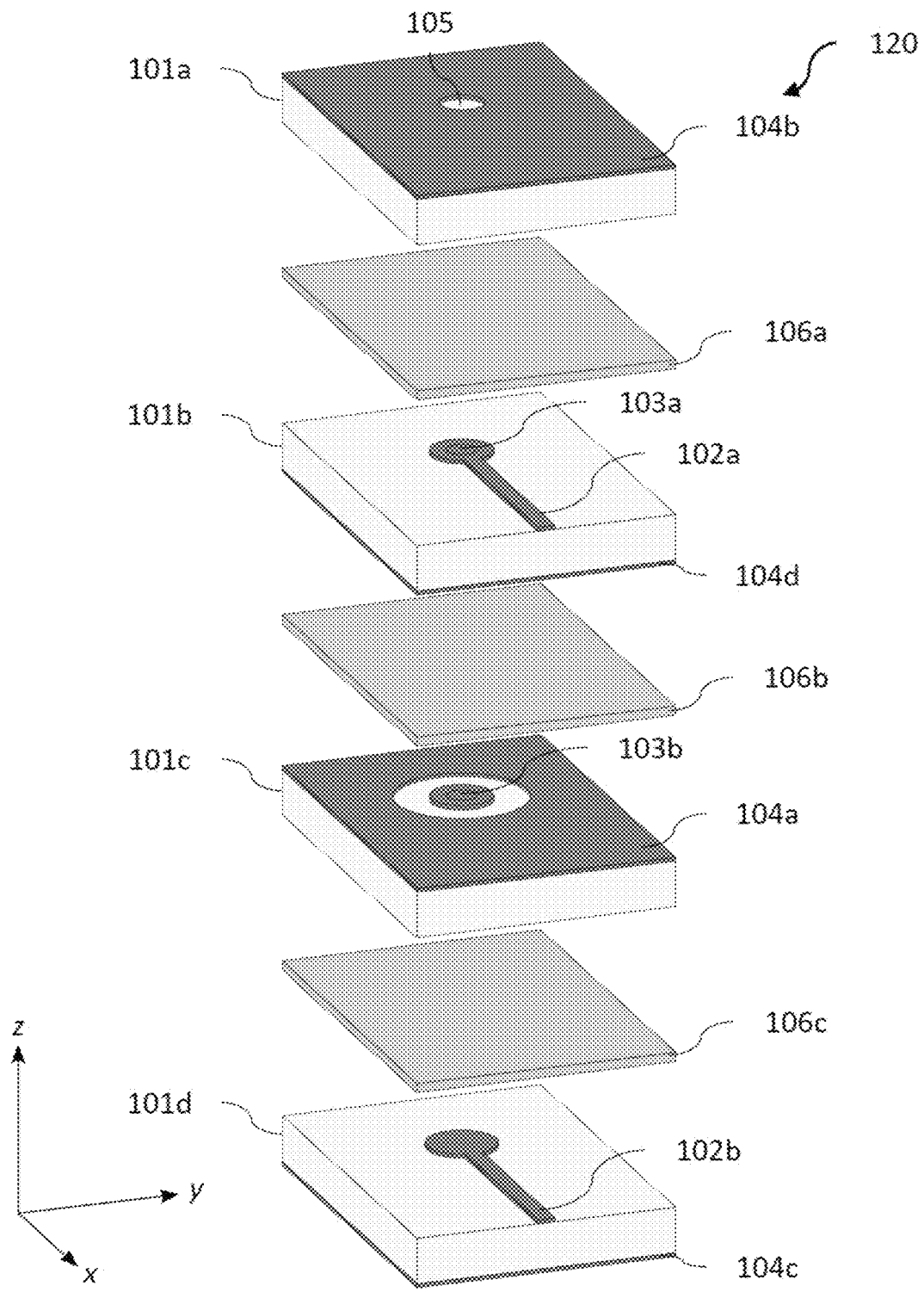
FIG. 4A is a stereoscopic view of a substrate 120 applicable to the first embodiment.
Figure 4B:
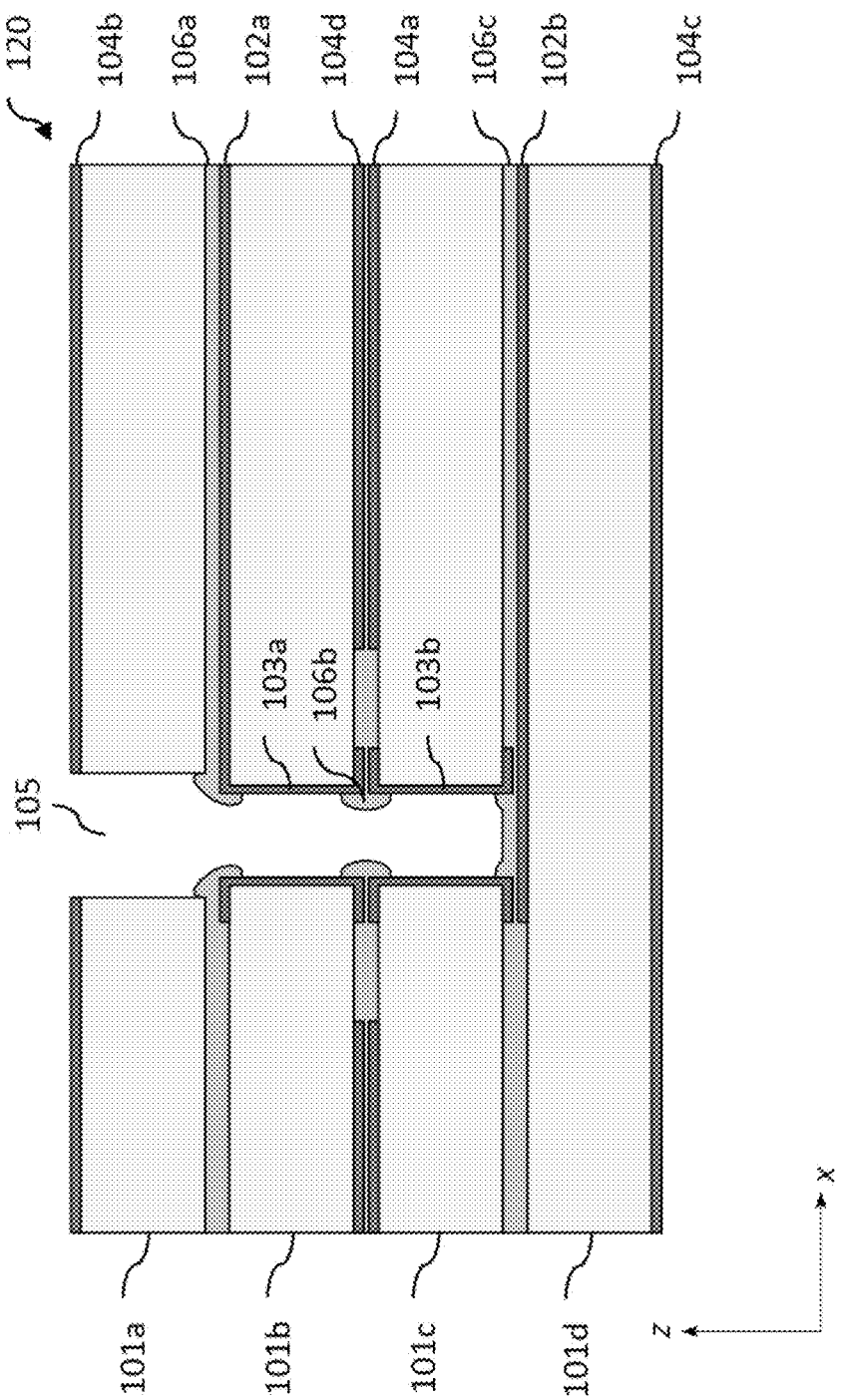
FIG. 4B is an xz cross-sectional view of the substrate 120 applicable to the first embodiment.

The substrate 110 may further include a planar conductor facing the planar conductor 104a with the bonding layer 106b interposed therebetween. FIG. 4A is a stereoscopic view of a substrate 120 according to Modified Example 4. The substrate 120 further includes a planar conductor 104d in addition to the components of the substrate 110. The planar conductor 104d is provided between the signal line 102a and the planar conductor 104a or between the planar conductor 104a and the signal line 102b. The planar conductors 104a and 104d face each other with the bonding layer 106b interposed therebetween. FIG. 4A illustrates an example in which the planar conductor 104a is provided on the face c1 of the dielectric substrate 101c. Thus, the planar conductor 104d is provided on the face b2 of the dielectric substrate 101b. For visibility purposes, FIG. 4A illustrates the substrate 120 before its individual layers are stacked, with gaps provided between the dielectric substrates 101a to 101d. FIG. 4B is an xz cross-sectional view of the substrate 120 after its individual layers are stacked. It should be noted that the planar conductor 104d may also be referred to as a fourth planar conductor.

For the planar conductor 104d, a conductor described with reference to the planar conductor 104a is applicable. At least one of the planar conductors 104a to 104d may be a different conductor. In addition, all of the planar conductors 104a to 104d may have the same shape, or at least one of them may have a different shape. The area of the planar conductor 104d is larger than the area of the signal line 102a. The planar conductor 104d is located away from and is not electrically connected to the conductive vias 103a and 103b as with the planar conductor 104a. Accordingly, the planar conductor 104b, the signal line 102a, and the planar conductor 104d form a strip line. Similarly, the planar conductor 104a, the signal line 102b, and the planar conductor 104c form a strip line. Accordingly, even when the thickness of the bonding layer 106b is changed, the characteristic impedance of the strip line, which is formed by the planar conductor 104b, the signal line 102a, and the planar conductor 104d, does not change. If the planar conductor 104a is provided on the face b2 of the dielectric substrate 101b, the planar conductor 104d is provided on the face c1 of the dielectric substrate 101c. In such a case, the planar conductor 104b, the signal line 102a, and the planar conductor 104a form a strip line, and the planar conductor 104d, the signal line 102b, and the planar conductor 104c form a strip line. Similarly, even when the thickness of the bonding layer 106b is changed, the characteristic impedance of the strip line, which is formed by the planar conductor 104d, the signal line 102b, and the planar conductor 104c, does not change. This can further suppress radiation of a high-frequency signal from the signal lines 102a and 102b to the outside of the substrate 120. Consequently, deterioration of transmission properties for high-frequency signals can be reduced.

In each of the substrates 110 and 120, the through-hole 105 is provided penetrating the planar conductor 104b as well. Accordingly, the through-hole 105 behaves like capacitance that cancels out the inductance components of the conductive vias 103a and 103b. Consequently, deterioration of transmission properties for high-frequency signals can be reduced.

Figure 4C:
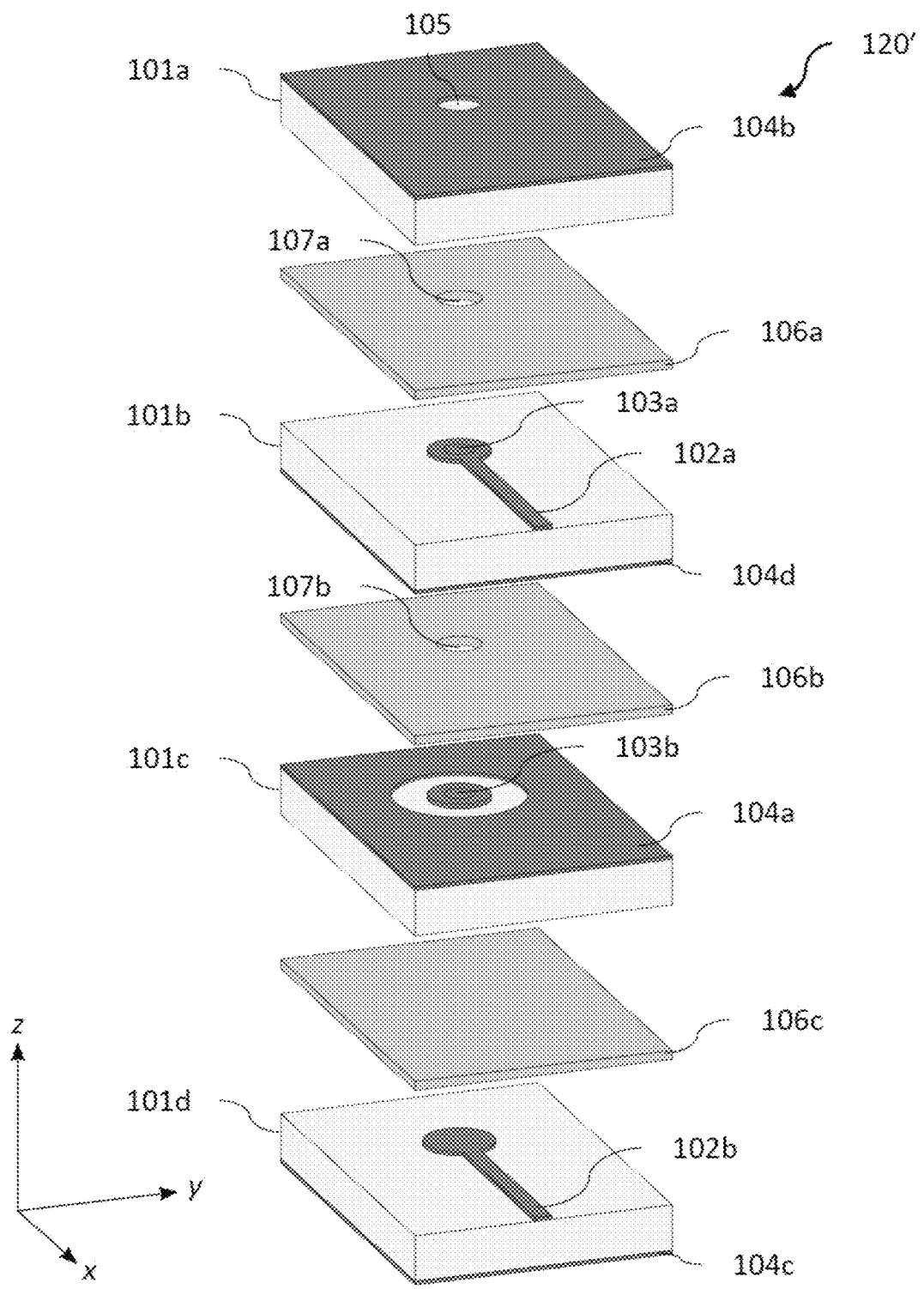
FIG. 4C is a stereoscopic view of a substrate 120' applicable to the first embodiment.

The bonding layers 106a and 106b may or may not be provided with holes corresponding to the through-hole 105 and the conductive vias 103a and 103b, respectively, before the individual layers are stacked as in Modified Example 2. FIG. 4A represents the substrate 120 when the bonding layers 106a and 106b are not provided with holes, and FIG. 4C is a stereoscopic view of a substrate 120' when the bonding layers 106a and 106b are provided with holes before the individual layers are stacked. In the substrate 120 also, the bonding layers 106a and 106b may be provided with holes corresponding to the through-hole 105 and the conductive vas 103a and 103b, respectively, after the individual layers are stacked.

Modified Example 5

Figure 5:
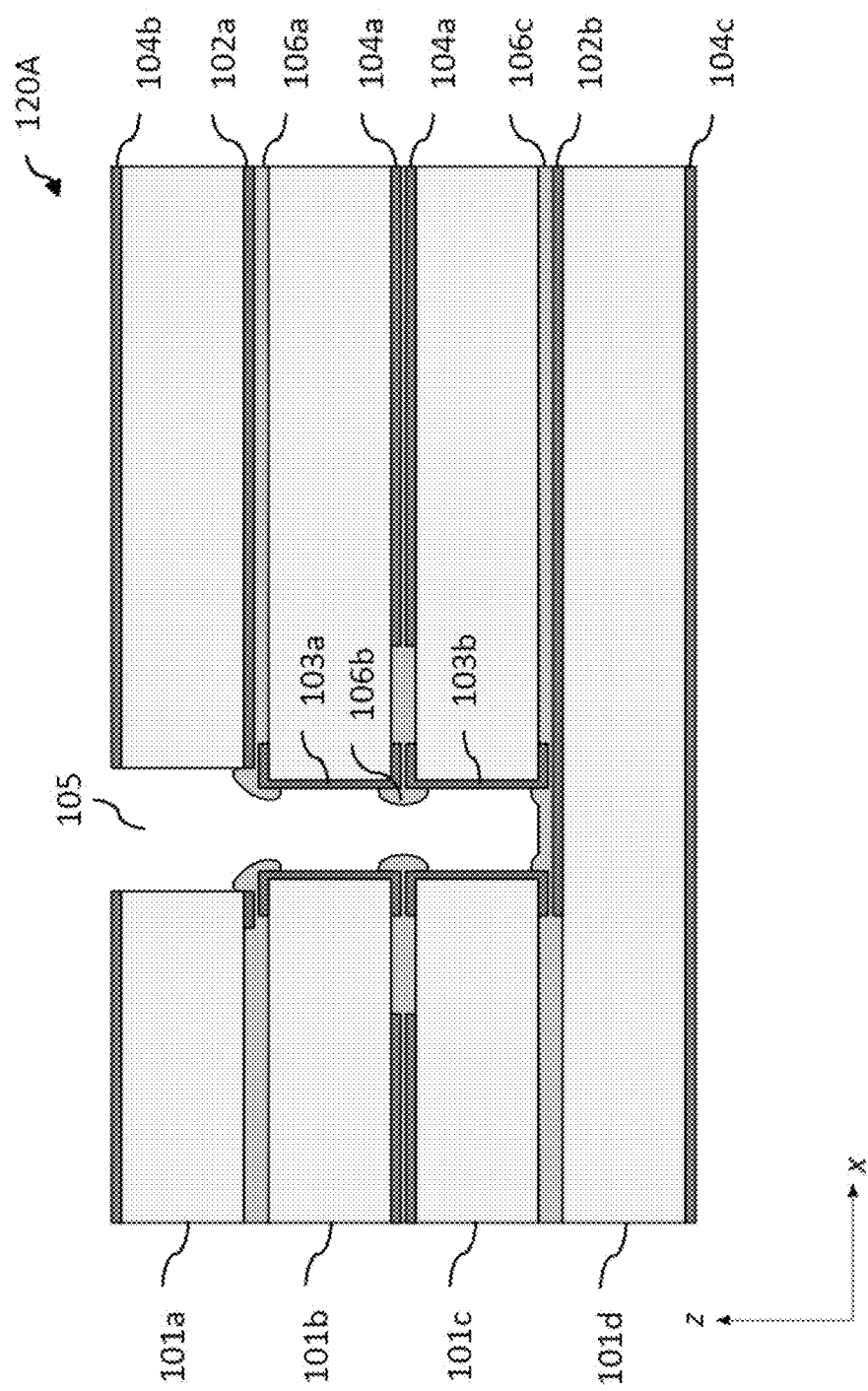
FIG. 5 is an xz cross-sectional view of a substrate 120A applicable to the first embodiment.

In the substrate 120, the signal line 102a is provided on the face b1 of the dielectric substrate 101b. The signal line 102a may be provided facing the face b1 with the bonding layer 106a interposed therebetween. FIG. 5 is an xz cross-sectional view of a substrate 120A. The substrate 120A includes the same components as the substrate 120, but the signal line 102a is provided on the face a2 of the dielectric substrate 101a. In such a case, the signal line 102a and the conductive via 103a may not be electrically connected due to the presence of the bonding layer 106a. However, a high-frequency signal can be propagated due to capacitance between the signal line 102a and the conductive via 103a. It should be noted that the thickness of the bonding layer 106a in such a case is a thickness that allows a high-frequency signal to be propagated due to capacitance between the signal line 102a and the conductive via 103a.

In such a case, the gap between the planar conductor 104b and the signal line 102a does not change depending on the thickness of the bonding layer 106a. When an element (not illustrated) is provided on the planar conductor 104b, the element is operated by electromagnetic coupling between the planar conductor 104b and the signal line 102a. Since the gap between the planar conductor 104b and the signal line 102a does not change, the element can be operated stably. Examples of such an element include an antenna element (e.g., a patch antenna) used for proximity coupling feeding or slot coupling.

Modified Example 6

Figure 6A:
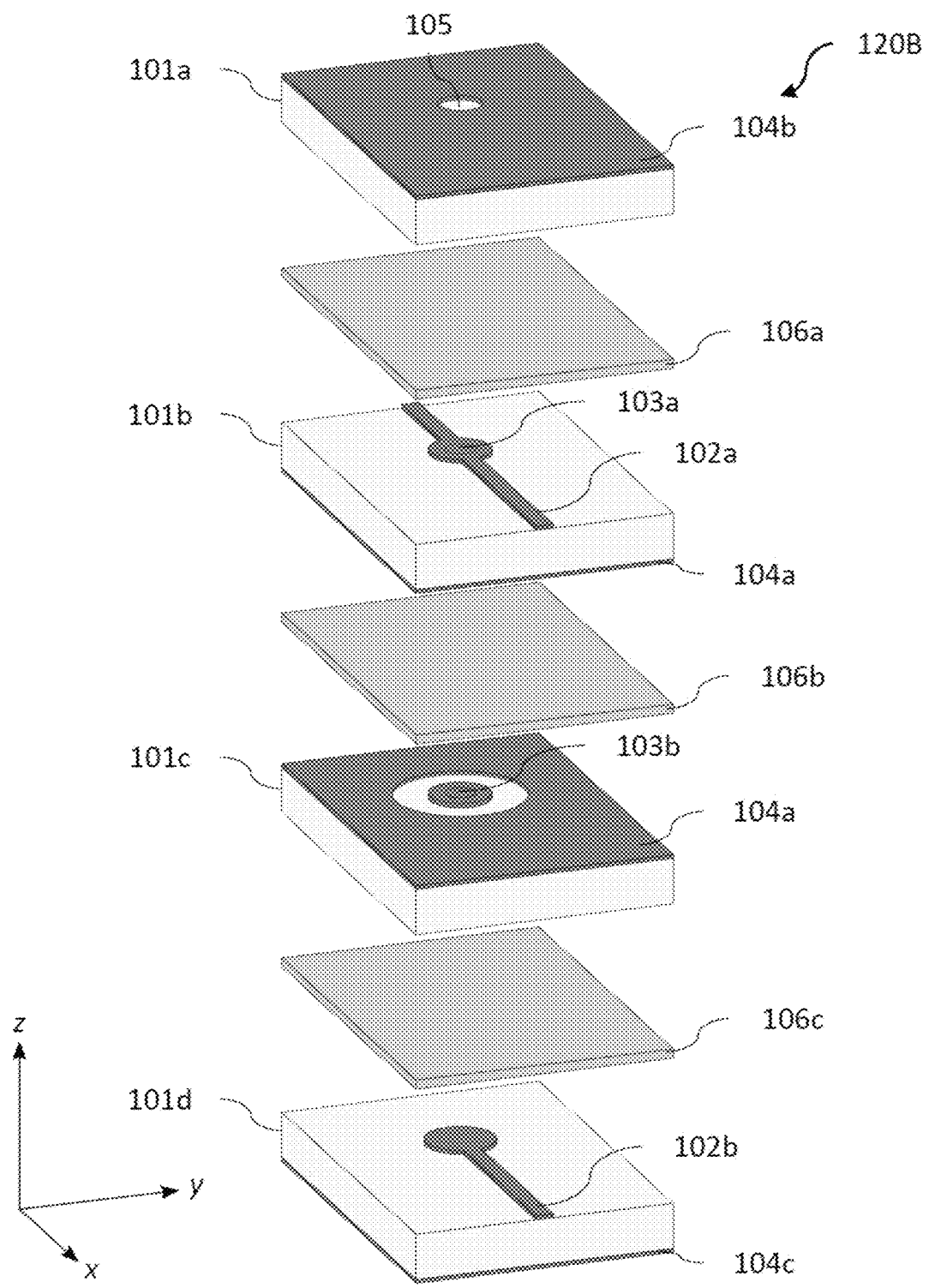
FIG. 6A is a stereoscopic view of a substrate 120B applicable to the first embodiment.
Figure 6B:
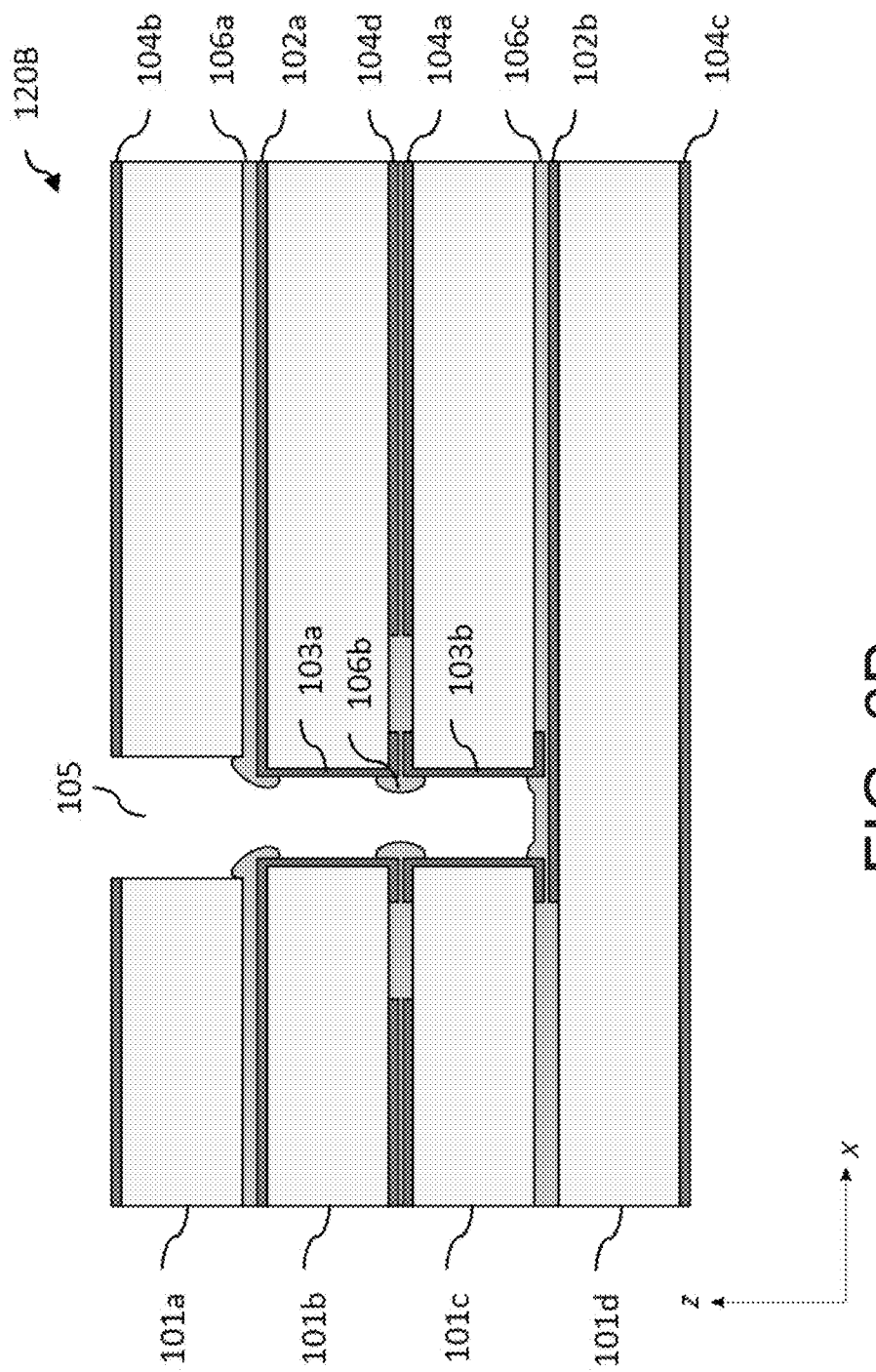
FIG. 6B is an xz cross-sectional view of the substrate 120B applicable to the first embodiment.

The signal line 102a is provided in the +x-direction with respect to the conductive via 103a, but may also be provided in the −x-direction. FIG. 6A illustrates a substrate 120B according to Modified Example 6. The substrate 120B includes the same components as the substrate 120, but the signal line 102a is also provided in the −x-direction. For visibility purposes, FIG. 6A illustrates the substrate 120B before its individual layers are stacked, with gaps provided between the dielectric substrates 101a to 101d. FIG. 6B is an xz cross-sectional view of the substrate 120B after its individual layers are stacked.

In the substrate 120B, when a high-frequency signal is input to the signal line 102b, the signal is output from the signal line 102a. In such a case, the signal is output by being distributed in two directions: the ±x-directions in which the signal line 102a is provided. Accordingly, the high-frequency signal can be output by being distributed.

Although Modified Example 6 illustrates an example in which the signal line 102a is provided in the ±x-directions, the direction(s) in which the signal line is provided may be any direction(s), and the number of distributions of a high-frequency signal may be any number. For example, the signal line 102a may be provided in the ±y-directions and a high-frequency signal may thus be distributed in the two directions, or the signal line 102a may be provided in the ±x-directions and the +y-direction and a high-frequency signal may thus be distributed in the three directions, or alternatively, the signal line 102a may be provided in the ±x-directions and the ±y-directions and a high-frequency signal may thus be distributed in the four directions. In addition, the signal line 102b may also be provided not only in the +x-direction with respect to the conductive via 103b but in any direction(s) and a high-frequency signal may thus be distributed in the direction(s) as with the signal line 102a. Accordingly, a single-input multiple-output, multiple-input single-output, or multiple-input multiple-output substrate can be formed.

Modified Example 7

The present embodiment has described that the through-hole 105 and the conductive via 103a, the conductive via 103a and the conductive via 103b, and the conductive via 103b and the signal line 102b may at least partially overlap in the first direction.

Figure 7:
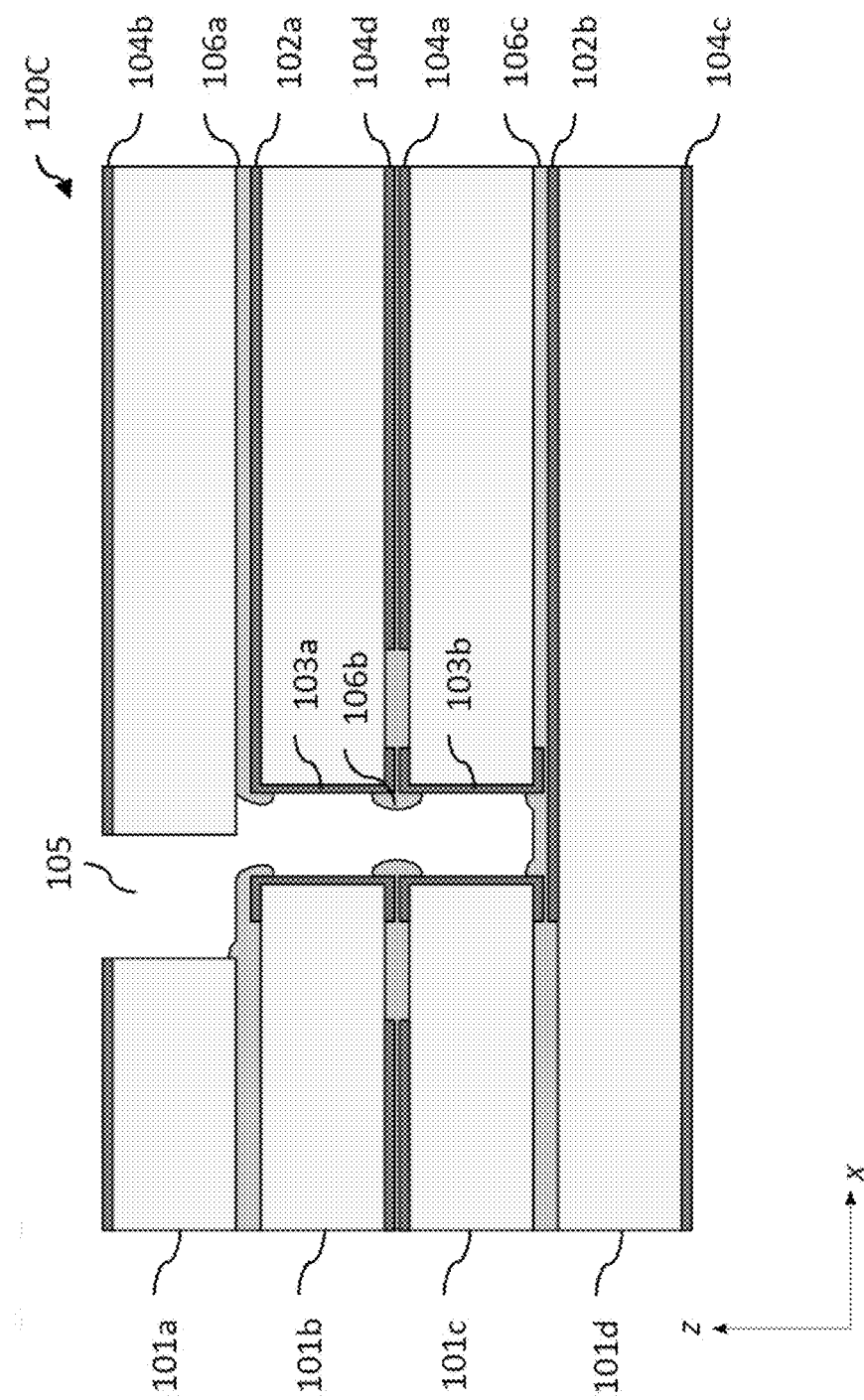
FIG. 7 is an xz cross-sectional view of a substrate 120C applicable to the first embodiment.

FIG. 7 is an xz cross-sectional view of a substrate 120C after its individual layers are stacked. The substrate 120C includes the same components as the substrate 120, but the positions of the through-hole 105 and the conductive via 103a are displaced from each other on the xy plane. In such a case also, the through-hole 105 and the conductive via 103a at least partially overlap in the first direction. Therefore, the substrate operates as in the present embodiment, and the same advantageous effects can thus be obtained. Further, design flexibility can be improved with regard to the position where the through-hole 105 is provided.

Figure 8:
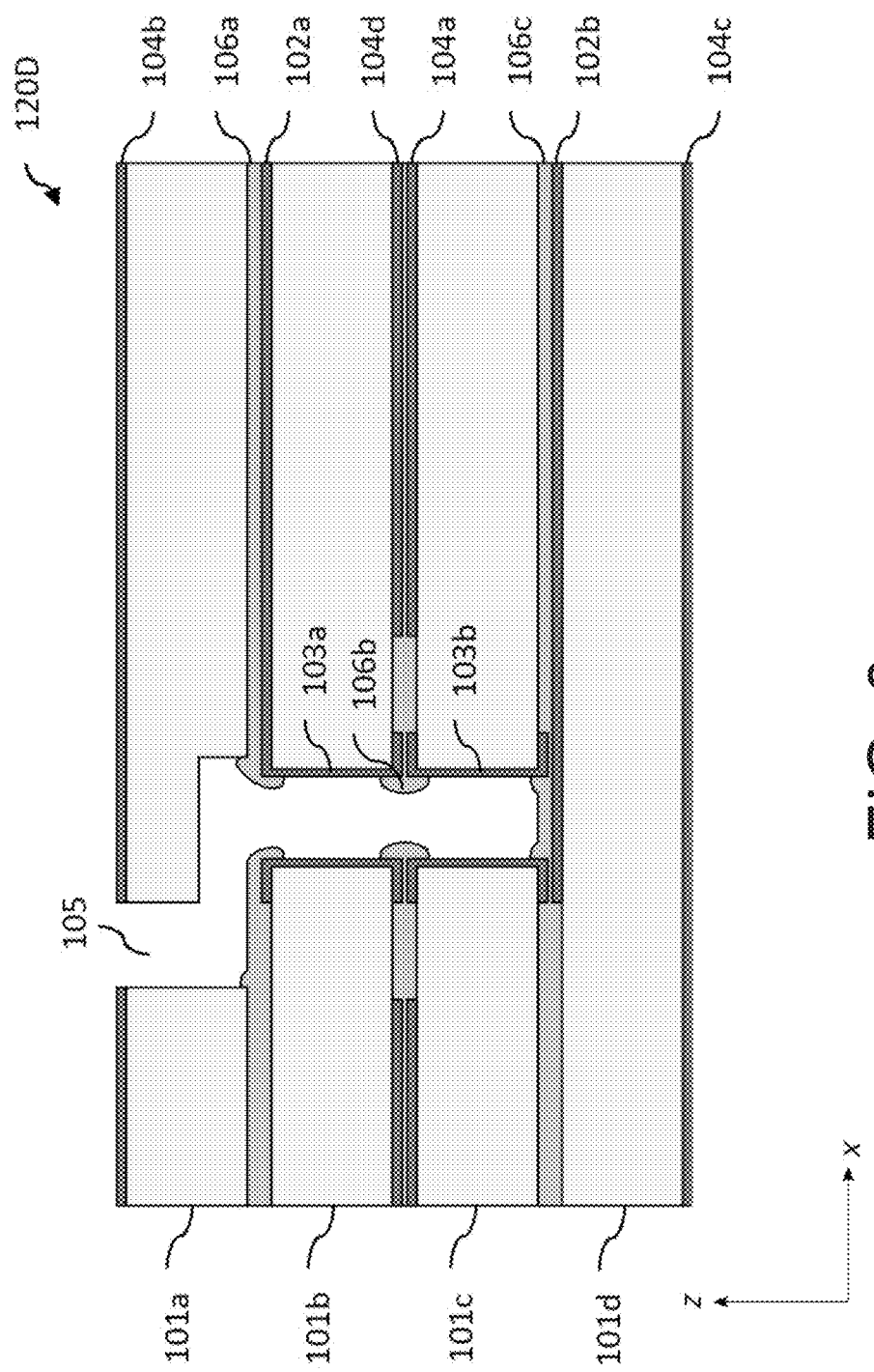
FIG. 8 is an xz cross-sectional view of a substrate 120D applicable to the first embodiment.

FIG. 8 is an xz cross-sectional view of a substrate 120D after its individual layers are stacked. The substrate 120D includes the same components as the substrate 120, but the through-hole 105 is provided with a vent. The vent can be provided by performing end milling or drilling on the dielectric substrate 101a, for example. Even when a vent is provided, the hole penetrating the dielectric substrate 101a from its face a1 to face a2 is assumed as the through-hole 105. In such a case also, the through-hole 105 and the conductive via 103a at least partially overlap in the first direction. Therefore, the substrate operates as in the present embodiment, and the same advantageous effects can thus be obtained. Further, design flexibility can be improved with regard to the position where the through-hole 105 is provided. For example, when a circuit element (not illustrated) is arranged on the planar conductor 104b, arrangement flexibility can be improved. Examples of the circuit element include electronic components, such as resistors and chip capacitors.

Figure 9:
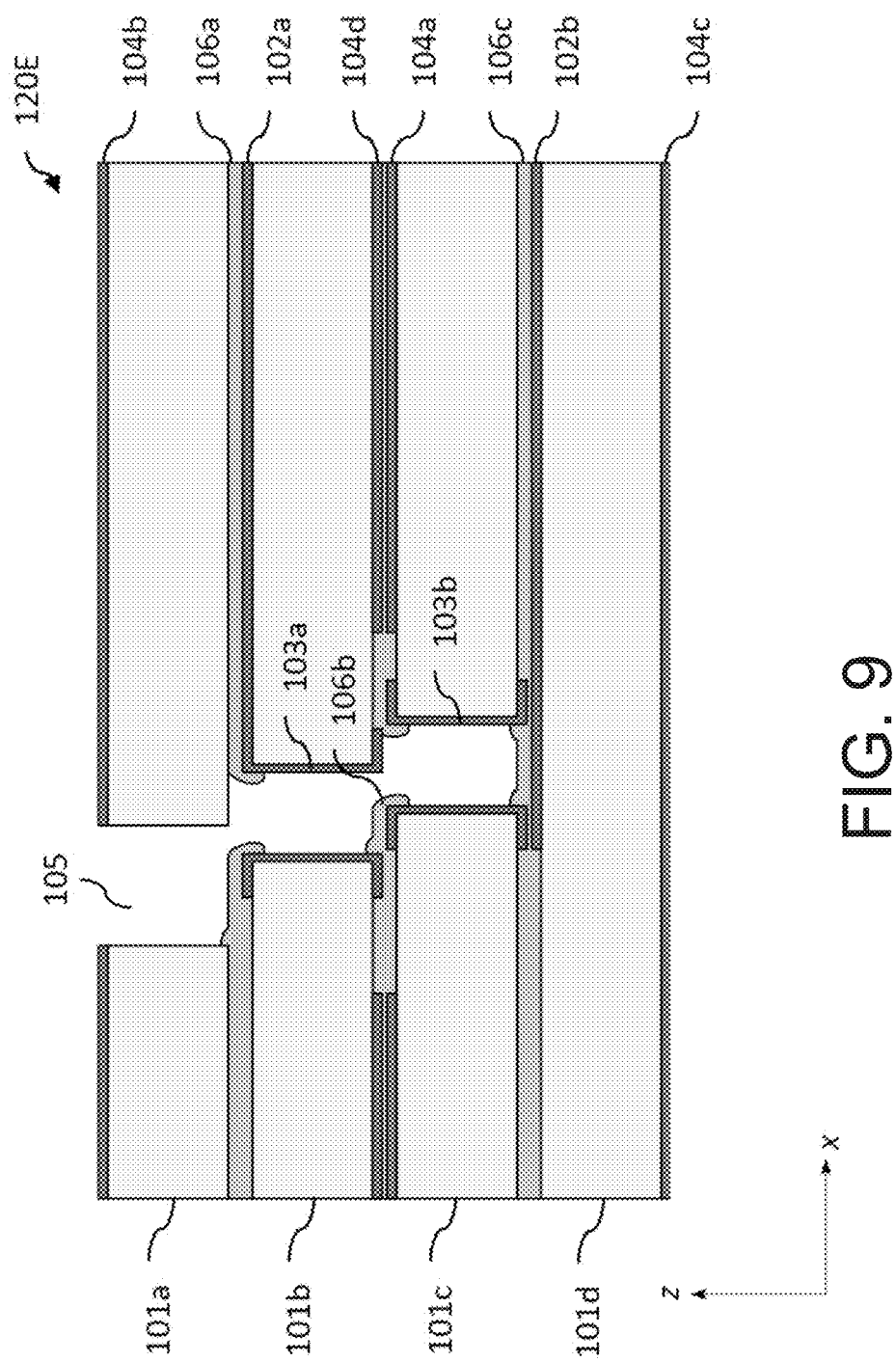
FIG. 9 is an xz cross-sectional view of a substrate 120E applicable to the first embodiment.

FIG. 9 is an xz cross-sectional view of a substrate 120E after its individual layers are stacked. The substrate 120E includes the same components as the substrate 120, but the positions of the through-hole 105 and the conductive via 103a on the xy plane, and the positions of the conductive via 103a and the conductive via 103b on the xy plane are displaced from each other, and the length of the signal line 102b is changed. In such a case also, the through-hole 105 and the conductive via 103a at least partially overlap in the first direction, the conductive via 103a and the conductive via 103b at least partially overlap in the first direction, and the conductive via 103b and the signal line 102b at least partially overlap in the first direction. Therefore, the substrate operates as in the present embodiment, and the same advantageous effects can thus be obtained. Further, design flexibility can be improved with regard to the positions where the through-hole 105 and the conductive vias 103a and 103b are provided.

Modified Example 8

Figure 10:
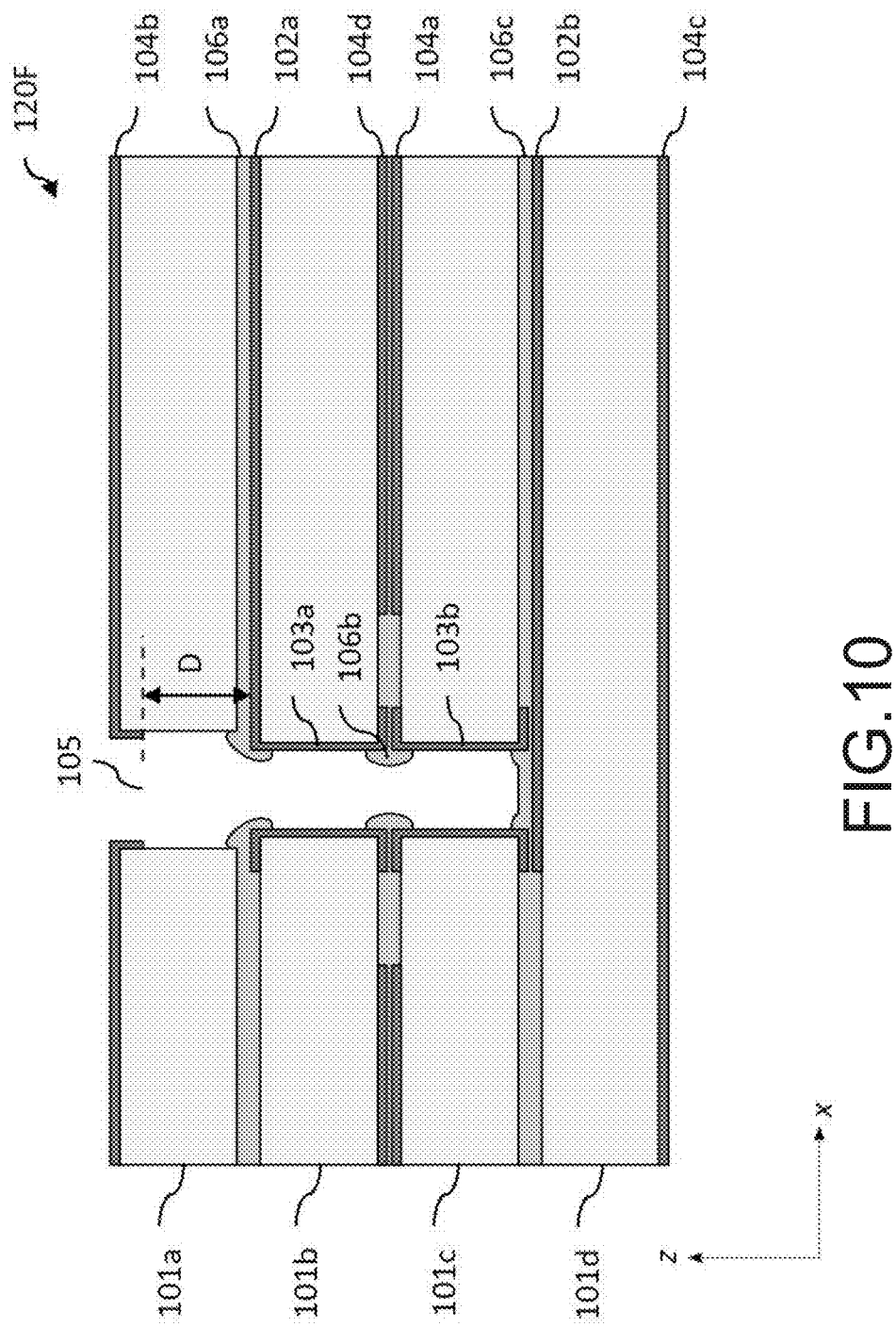
FIG. 10 is an xz cross-sectional view of a substrate 120F applicable to the first embodiment.

The present embodiment has described that at least a part of the inner wall of the through-hole 105 is not covered with a conductor. FIG. 10 is an xz cross-sectional view of a substrate 120F according to Modified Example 8 after its individual layers are stacked. The substrate 120F includes the same components as the substrate 120, but a part of the inner wall of the through-hole 105 is covered with a conductor. However, a portion of the inner wall of the through-hole 105 within a distance D from the signal line 102a in the first direction is not covered with the conductor. In the substrate 120F, the dielectric substrate 101a and the dielectric substrate 101b are joined with the bonding layer 106a. In such a case, the distance D is determined based on at least one of the diameter of the through-hole 105, the diameter of the conductive via 103a, the width of the signal line 102a, the material of the bonding layer 106a, and the thickness of the bonding layer 106a in the first direction. Accordingly, the possibility that a high-frequency signal may be propagated to a part of the dielectric substrate 101a can be reduced, and thus, the possibility that the through-hole 105 may act as a stub can be reduced. Consequently, deterioration of transmission properties for high-frequency signals can be reduced.

Modified Example 9

Figure 11A:
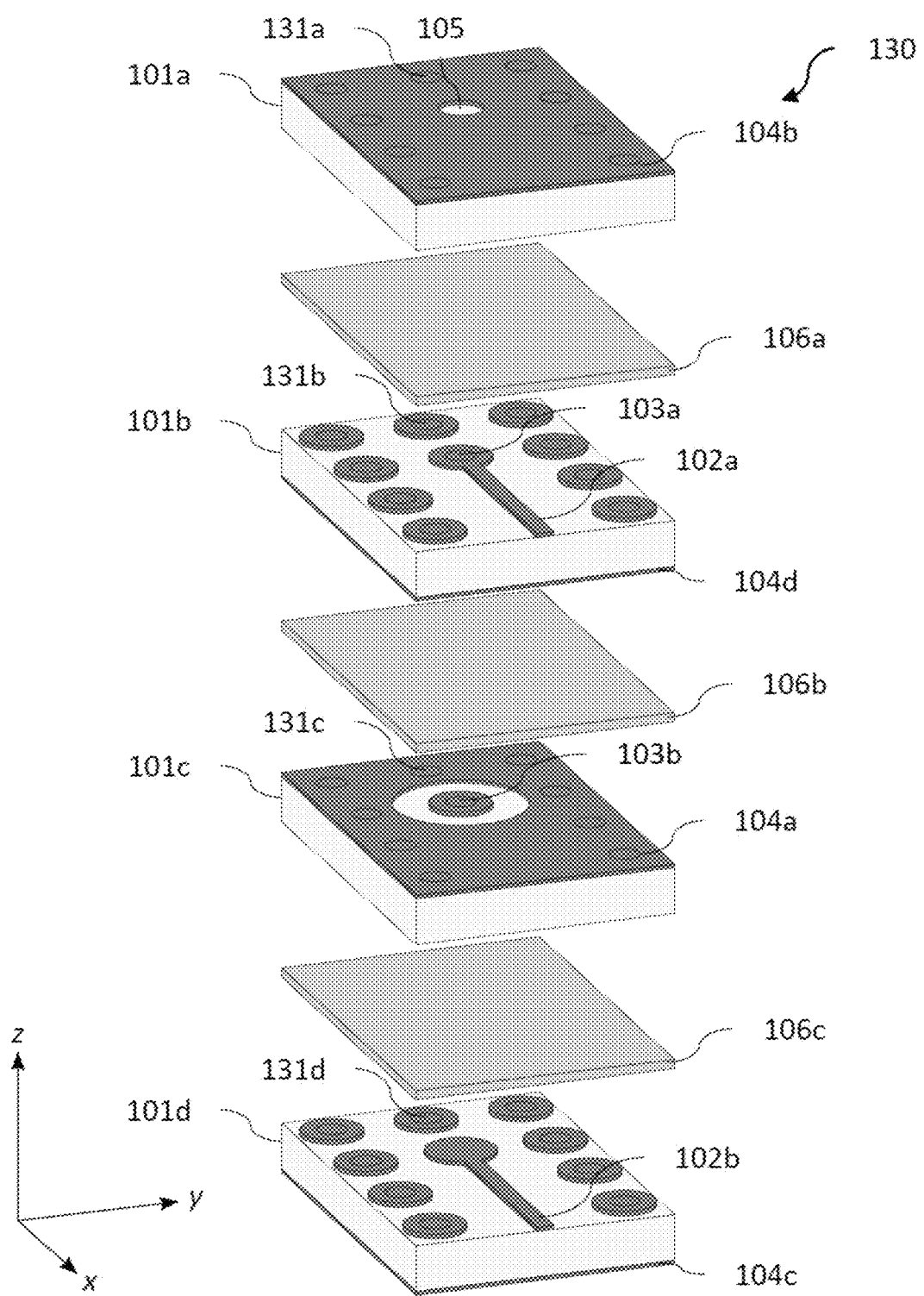
FIG. 11A is a stereoscopic view of a substrate 130 applicable to the first embodiment.
Figure 11B:
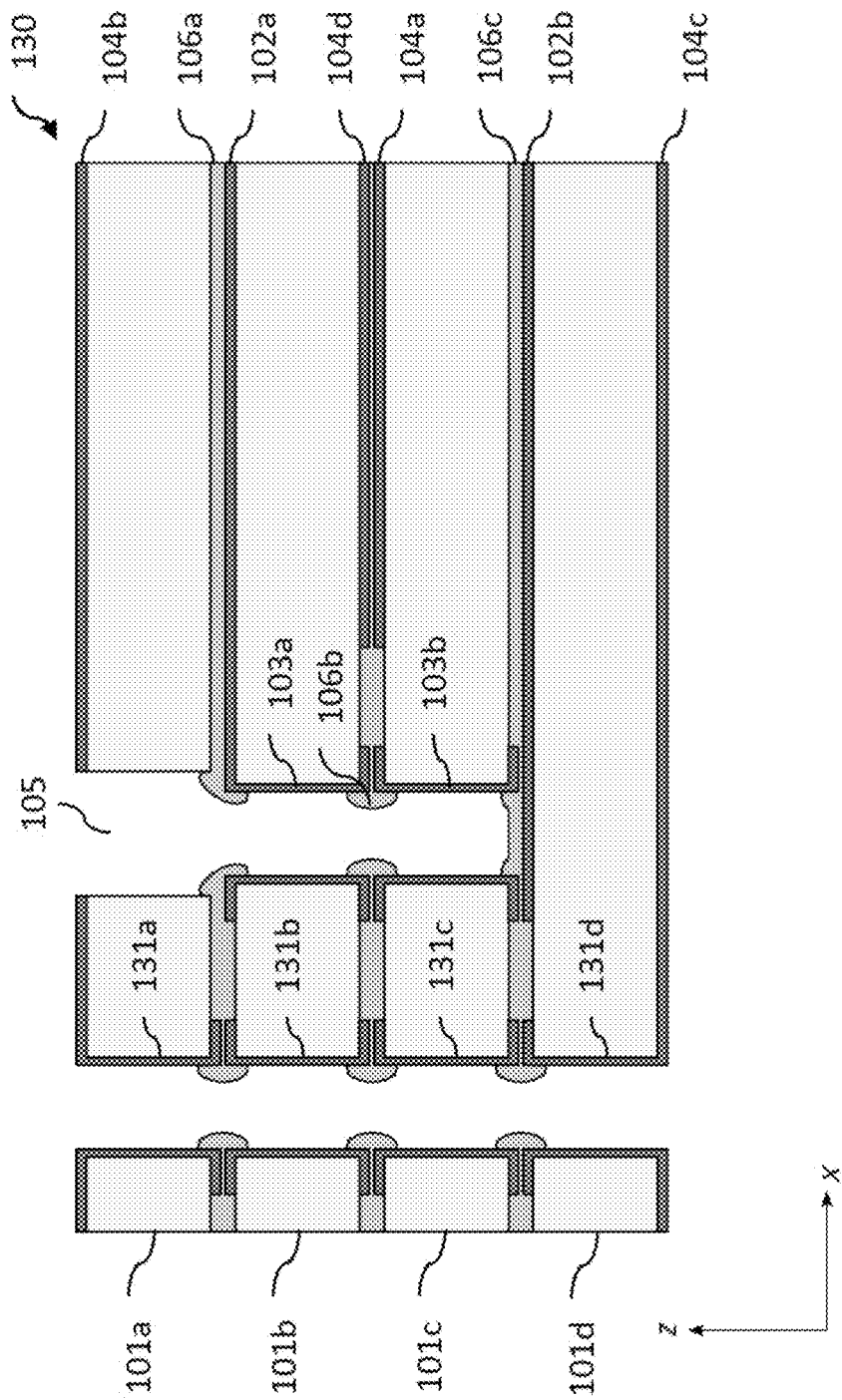
FIG. 11B is an xz cross-sectional view of the substrate 130 applicable to the first embodiment.

FIG. 11A is a stereoscopic view of a substrate 130 according to Modified Example 9. The substrate 130 includes a plurality of conductive vias 131a in the dielectric substrate 101a, a plurality of conductive vias 131b in the dielectric substrate 101b, a plurality of conductive vias 131c in the dielectric substrate 101c, and a plurality of conductive vias 131d in the dielectric substrate 101d, in addition to the components of the substrate 120. For visibility purposes, FIG. 11A illustrates the substrate 130 before its individual layers are stacked, with gaps provided between the dielectric substrates 101a to 101d. FIG. 11B is an xz cross-sectional view of the substrate 130 after its individual layers are stacked. It should be noted that the conductive vias 131a may also be referred to as third conductive vias, the conductive vias 131b may also be referred to as fourth conductive vias, the conductive vias 131c may also be referred to as fifth conductive vias, and the conductive vias 131d may also be referred to as sixth conductive vias.

The conductive vias 131a are provided penetrating the dielectric substrate 101a from its face a1 to face a2, and are electrically connected to the planar conductor 104b. The conductive vias 131a are provided around the through-hole 105. The gap between the adjacent conductive vias 131a on the xy plane is less than or equal to half the guide wavelength of a high-frequency signal. Although the conductive vias 131a are provided so as to surround the through-hole 105 in FIG. 11A, the arrangement of the conductive vias 131a is not limited thereto. It is acceptable as long as at least one side around the through-hole 105 is covered.

The conductive vias 131b are provided penetrating the dielectric substrate 101b from its face b1 to face b2, and are electrically connected to the planar conductor 104d. The conductive vias 131b are provided around the conductive via 103a and the signal line 102a. The gap between the adjacent conductive vias 131b on the xy plane is less than or equal to half the guide wavelength of a high-frequency signal. Although the conductive vias 131b are provided so as to surround the conductive via 103a and the signal line 102a in FIG. 11A, the arrangement of the conductive vias 131b is not limited thereto. It is acceptable as long as at least one side around the conductive via 103a and the signal line 102a is covered. In addition, the conductive vias 131a and 131b at least partially overlap in the first direction. When the bonding layer 106a is provided, the conductive vias 131a and the conductive vias 131b are not electrically connected, but a high-frequency signal can be propagated due to capacitance between the conductive vias 131a and 131b. The conductive vias 131a and 131b can reduce leakage of a high-frequency signal due to a parallel plate mode of the conductive via 103a and the signal line 102a. Consequently, deterioration of transmission properties for high-frequency signals can be reduced.

The conductive vias 131c are provided penetrating the dielectric substrate 101c from its face c1 to face c2, and are electrically connected to the planar conductor 104a. The conductive vias 131c are provided around the conductive via 103b. The gap between the adjacent conductive vias 131c on the xy plane is less than or equal to half the guide wavelength of a high-frequency signal. Although the conductive vias 131c are provided so as to surround the conductive via 103b in FIG. 11A, the arrangement of the conductive vias 131c is not limited thereto. It is acceptable as long as at least one side around the conductive via 103b is covered.

The conductive vias 131d are provided penetrating the dielectric substrate 101d from its face d1 to face d2, and are electrically connected to the planar conductor 104c. The conductive vias 131d are provided around the conductive via 103b and the signal line 102b, and the gap between the adjacent conductive vias 131d on the xy plane is less than or equal to half the guide wavelength of a high-frequency signal. Although the conductive vias 131d are provided so as to surround the conductive via 103b and the signal line 102b in FIG. 11A, the arrangement of the conductive vias 131d is not limited thereto. It is acceptable as long as at least one side around the conductive via 103b and the signal line 102b is covered. In addition, the conductive vias 131c and 131d at least partially overlap in the first direction. When the bonding layer 106c is provided, the conductive vias 131c and the conductive vias 131d are not electrically connected, but a high-frequency signal can be propagated due to capacitance between the conductive vias 131c and 131d. The conductive vias 131c and 131d can reduce leakage of a high-frequency signal due to a parallel plate mode of the conductive via 103b and the signal line 102b. Consequently, deterioration of transmission properties for high-frequency signals can be reduced.

The conductive vias 131b and 131c may partially overlap in the first direction as represented in FIGS. 11A and 11B. In addition, although FIGS. 11A and 11B each represent a case where the conductive vias 131a to 131d are provided, it is also possible to provide only the conductive vias 131a and 131b, or only the conductive vias 131c and 131d.

Modified Example 10

Figure 12:
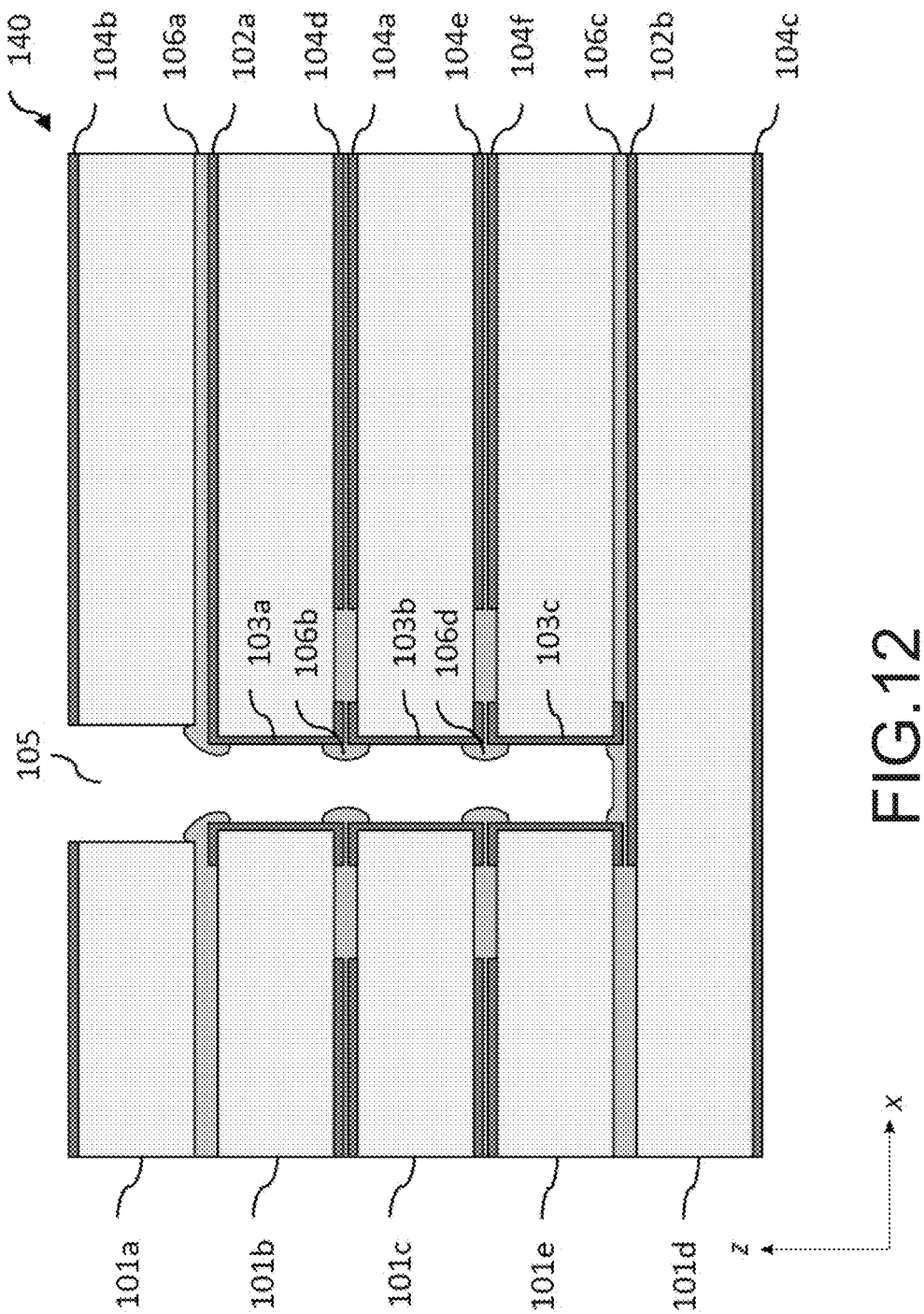
FIG. 12 is an xz cross-sectional view of a substrate 140 applicable to the first embodiment.

Described heretofore is a substrate including the four dielectric substrates 101a to 101d. However, the substrate may include five or more dielectric substrates that are stacked. FIG. 12 is an xz cross-sectional view of a substrate 140 after its individual layers are stacked. The substrate 140 further includes a dielectric substrate 101e, a conductive via 103c, planar conductors 104e and 104f, and a bonding layer 106d in addition to the components of the substrate 120. The substrate 140 is a structure in which the dielectric substrate 101e is provided between the dielectric substrates 101c and 101d of the substrate 120. In addition, a face of the dielectric substrate 101e parallel with the xy plane in the +z-direction is referred to as a face e1, and a face of the dielectric substrate 101e parallel with the xy plane in the −z-direction is referred to as a face e2.

The dielectric substrate 101e is provided between the dielectric substrates 101c and 101d. Materials same as those described with reference to the dielectric substrates 101a to 101d are applicable. The conductive via 103c is provided penetrating the dielectric substrate 101e from its face e1 to face e2, and materials same as those described with reference to the conductive vias 103a and 103b are applicable. In the substrate 140, the conductive vias 103b and 103c at least partially overlap in the first direction, and the conductive via 103c and the signal line 102b at least partially overlap in the first direction. Accordingly, the outside of the substrate 140 and spaces in the through-hole 105 and the conductive vias 103a to 103c can be connected.

The planar conductors 104e and 104f are provided between the dielectric substrates 101c and 101e. In FIG. 12, the planar conductor 104e is provided on the face c2 of the dielectric substrate 101c, and the planar conductor 104f is provided on the face e1 of the dielectric substrate 101e. To the planar conductors 104e and 104f, materials same as those described with reference to the planar conductors 104a to 104d are applicable. The area of each of the planar conductors 104e and 104f is larger than the area of each of signal lines 102a and 102b. The planar conductors 104e and 104f serve the function of suppressing radiation of a high-frequency signal to the outside of the substrate 140 as with the planar conductors 104d and 104a.

The bonding layer 106d is provided between the dielectric substrates 101c and 101e, and thus joins the dielectric substrates 101c and 101e. In such a case, the bonding layer 106c joins the dielectric substrates 101e and 101d. The planar conductors 104e and 104f face each other with the bonding layer 106d interposed therebetween. To the bonding layer 106d, materials same as those described with reference to the bonding layers 106a to 106c are applicable.

In the substrate 140, a high-frequency signal input to one of the signal lines 102a and 102b is propagated to the other signal line as in the substrate 120. The high-frequency signal is propagated from one of the signal lines to the other signal line via the conductive via 103c in addition to the conductive vias 103a and 103b. The conductive vias 103b and 103c, and the conductive via 103c and the signal line 102b may not be electrically connected due to the presence of the bonding layers 106d and 106c, respectively. However, a high-frequency signal can be propagated due to capacitance between the conductive vias 103b and 103c and capacitance between the conductive via 103c and the signal line 102b. As described above, even when the substrate includes one more dielectric substrate 101 with the conductive via 103, the substrate can be operated as in the present embodiment. The same holds true for when the substrate includes two or more dielectric substrates 101 each having the conductive via 103. Increasing the number of the dielectric substrates 101 can increase the rigidity of the resulting substrate. Herein, at least one of the planar conductors 101d to 101f may be omitted. This can reduce the number of the steps of producing the substrate 140, and thus can reduce the production cost.

Figure 13:
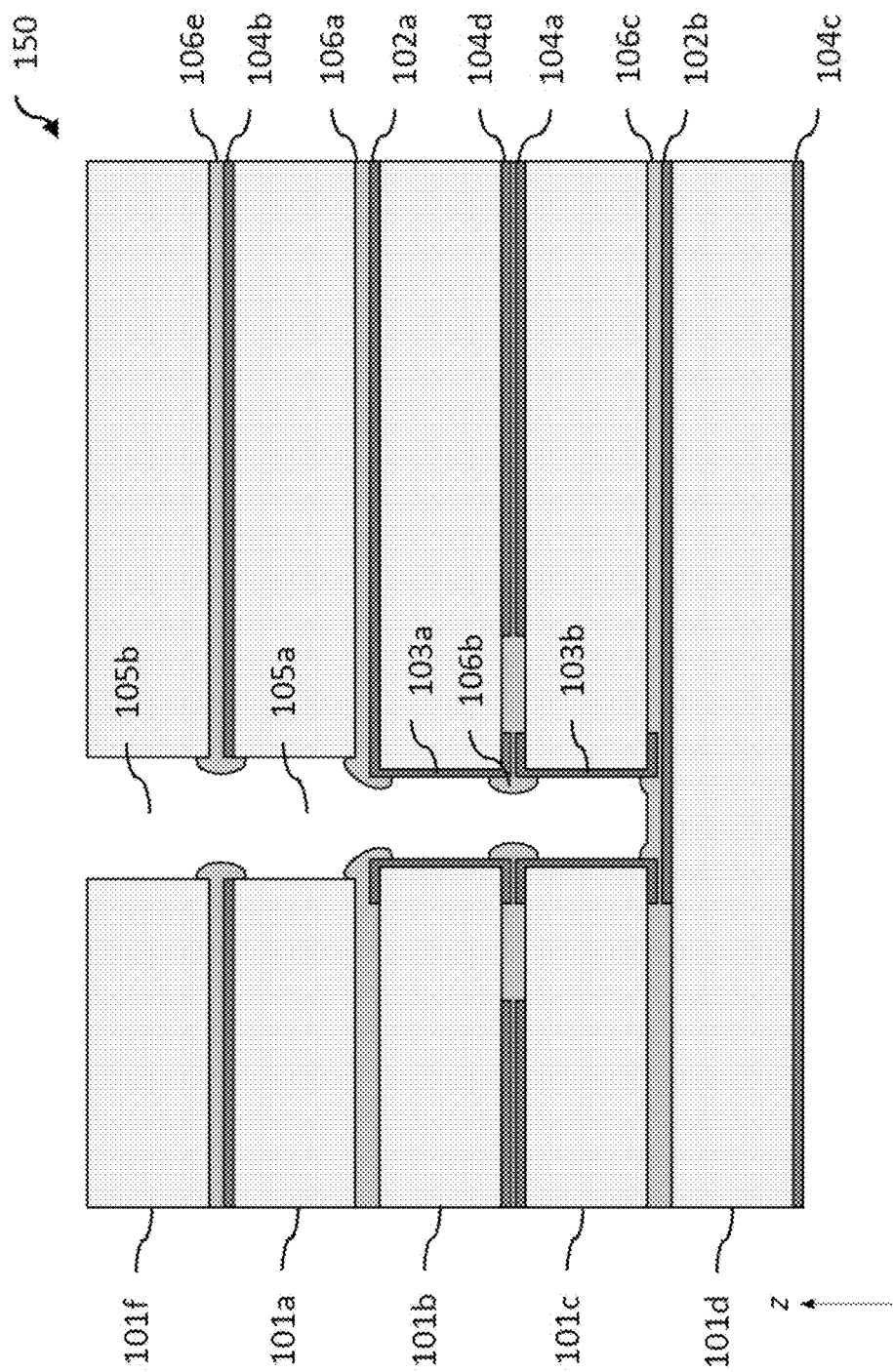
FIG. 13 is an xz cross-sectional view of a substrate 150 applicable to the first embodiment.

Regarding the substrate 140, a case where the number of the dielectric substrates 101 each having the conductive via 103 is increased has been described. However, it is also possible to increase the number of the dielectric substrates 101 each having the through-hole 105. FIG. 13 is an xz cross-sectional view of a substrate 150 after its individual layers are stacked. The substrate 150 further includes a dielectric substrate 101f and a bonding layer 106e in addition to the components of the substrate 120. The dielectric substrate 101f is provided with a through-hole 105b. Herein, the through-hole 105 of the dielectric substrate 101a is denoted by 105a. The substrate 150 is a structure in which the dielectric substrate 101f is further provided on the dielectric substrate 101a of the substrate 120. In addition, a face of the dielectric substrate 101f parallel with the xy plane in the +z-direction is referred to as a face f1, and a face of the dielectric substrate 101f parallel with the xy plane in the −z-direction is referred to as a face f2.

The dielectric substrate 101f is provided on the dielectric substrate 101a, and materials same as those described with reference to the dielectric substrates 101a to 101e are applicable. The through-hole 105b is provided penetrating the dielectric substrate 101f from its face f1 to face f2. To the through-hole 105b, a formation method and a shape same as those described with reference to the through-hole 105 are applicable.

The inner wall of the through-hole 105b, that is, a portion of the dielectric substrate 101f in which the through-hole 105b is provided may be either covered with or not covered with a conductor. This is because a distance for preventing deterioration of transmission properties for high-frequency signals is already secured by the dielectric substrate 101a having the through-hole 105a. In the substrate 150, the through-holes 105b and 105a at least partially overlap in the first direction. Accordingly, the outside of the substrate 150 and spaces in the through-holes 105b and 105a and the conductive vias 103a and 103b can be connected.

The bonding layer 106e is provided between the dielectric substrates 101f and 101a, and thus joins the dielectric substrates 101f and 101a. To the bonding layer 106e, materials same as those described with reference to the bonding layers 106a to 106c are applicable.

Propagation of a high-frequency signal from one of the signal lines 102a and 102b to the other signal line is conducted in the same manner as in the substrate 120. As described above, even when the substrate includes one more dielectric substrate 101 having the through-hole 105, the substrate can be operated as in the present embodiment. The same holds true for when the substrate includes two or more dielectric substrates 101 each having the through-hole 105. Increasing the number of the dielectric substrates 101 can increase the rigidity of the resulting substrate. It is also possible to increase both the number of the dielectric substrates 101 each having the conductive via 103 and the number of the dielectric substrates 101 each having the through-hole 105.

Modified Example 11

Figure 14:
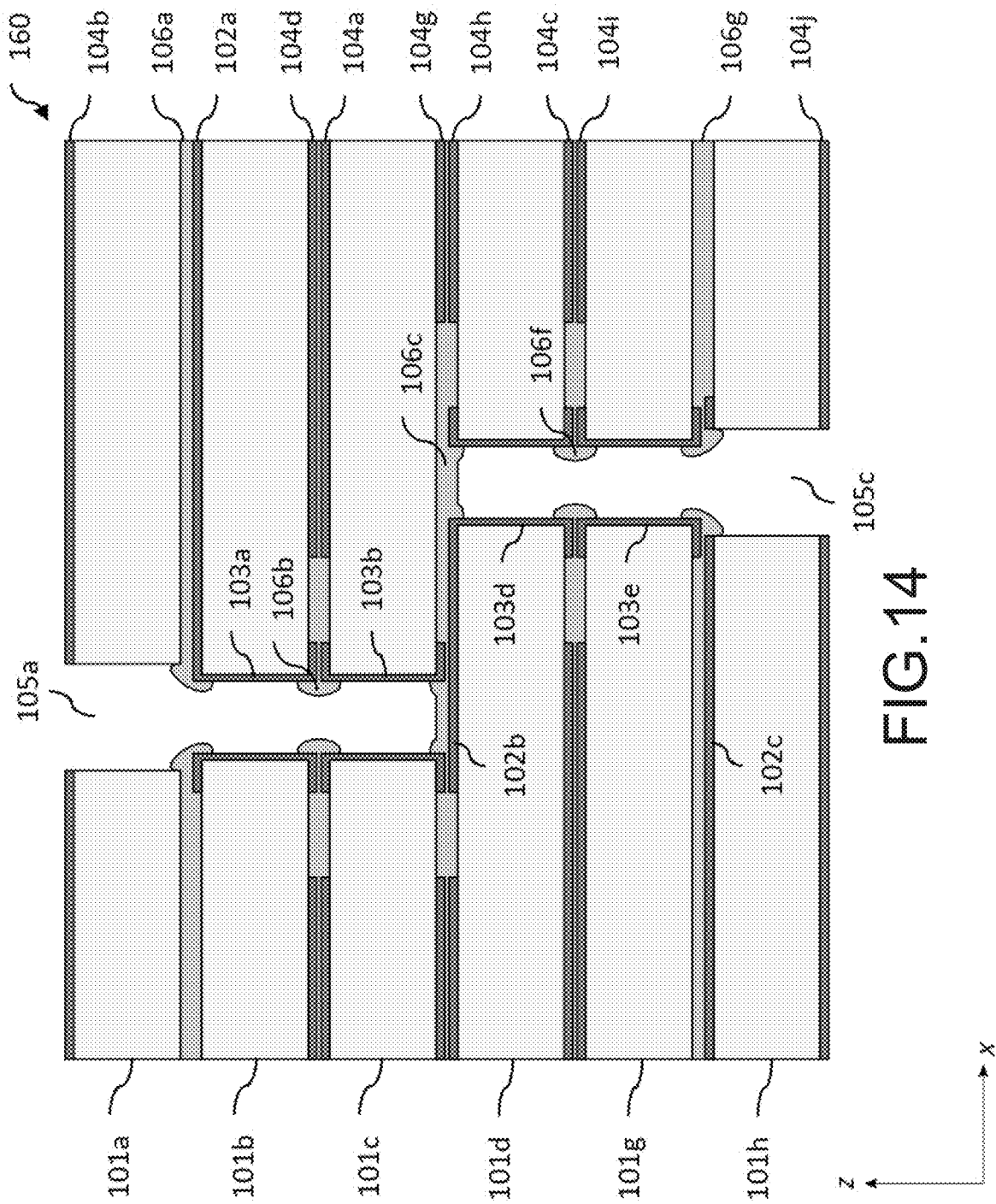
FIG. 14 is an xz cross-sectional view of a substrate 160 applicable to the first embodiment.

In the aforementioned description, the through-hole 105 and the conductive vias 103a and 103b are provided in the −z-direction. However, the through-hole 105 and the conductive vias 103a and 103b may also be provided in the +z-direction. FIG. 14 is an xz cross-sectional view of a substrate 160 after its individual layers are stacked. The substrate 160 further includes dielectric substrates 101g, and 101h, a signal line 102c, conductive vias 103d and 103e, planar conductors 104g, 104h, 104i, and 104j, and bonding layers 106f and 106g in addition to the components of the substrate 120. The dielectric substrate 101h is provided with a through-hole 105c. In the substrate 160, a high-frequency signal input to one of the signal lines 102a and 102c is output from the other of the signal lines 102a and 102c via the conductive vias 103a and 103b, the signal line 102b, and the conductive vias 103d and 103e. It should be noted that in the present modified example, the through-hole 105 of the dielectric substrate 101a is denoted by 105a.

For the dielectric substrates 101g and 101h, materials same as those described with reference to the dielectric substrates 101a to 101f are applicable. A face of the dielectric substrate 101g parallel with the xy plane in the +z-direction is referred to as a face g1. A face of the dielectric substrate 101g parallel with the xy plane in the −z-direction is referred to as a face g2. A face of the dielectric substrate 101h parallel with the xy plane in the +z-direction is referred to as a face h1. A face of the dielectric substrate 101h parallel with the xy plane in the −z-direction is referred to as a face h2. It should be noted that the dielectric substrate 101g may also be referred to as a fifth dielectric substrate, the dielectric substrate 101h may also be referred to as a sixth dielectric substrate, the face g1 may also be referred to as a ninth face, the face g2 may also be referred to as a tenth face, the face h1 may also be referred to as an eleventh face, and the face h2 may also be referred to as a twelfth face.

The signal line 102c propagates a high-frequency signal. The signal line 102c is a signal line for propagating a high-frequency signal to the signal line 102a or receiving a high-frequency signal propagated from the signal line 102a. The signal line 102c is provided between the dielectric substrates 101g and 101h. FIG. 14 illustrates an example in which the signal line 102c is provided on the face h1 of the dielectric substrate 101h. To the signal line 102c, materials, surface treatment, an element connected thereto, and the like same as those described with reference to the signal lines 102a and 102b are applicable. It should be noted that the signal line 102c may also be referred to as a third signal line.

The conductive vias 103d and 103e propagate a high-frequency signal from one of the signal lines 102b and 102c to the other signal line. That is, a high-frequency signal propagated to the signal line 102b is propagated to the signal line 102c via the conductive vas 103d and 103e, and a high-frequency signal input to the signal line 102c is propagated to the signal line 102b via the conductive vias 103e and 103d. The conductive via 103d is provided penetrating the dielectric substrate 101d from its face d1 to face d2, and the conductive via 103e is provided penetrating the dielectric substrate 101g from its face g1 to face g2. It should be noted that the conductive via 103d may also be referred to as a seventh conductive via, and the conductive via 103e may also be referred to as an eighth conductive via. Although the conductive vias 103d and 103e are each represented in a cylindrical shape in FIG. 14, the conductive vias 103d and 103e may have any other shapes, such as an elliptical shape, a rectangular shape, or a shape at least partially including a curve.

The signal line 102b and the conductive via 103d, and the conductive via 103e and the signal line 102c are electrically connected, or are provided at a distance therebetween that allows a high-frequency signal to be propagated due to capacitance. The conductive via 103e and the through-hole 105c at least partially overlap in the penetrating direction of at least one of the conductive vias 103d and 103e (i.e., the z-direction in the present modified example). Hereinafter, the penetrating direction of at least one of the conductive vias 103d and 103e may also be referred to as a second direction. In the present modified example, description is made on the assumption that the first direction and the second direction are the same direction. The conductive vias 103d and 103e at least partially overlap in the second direction. Accordingly, a space in the through-hole 105c, a space in the conductive via 103d, and a space in the conductive via 103e are connected (i.e., serve as an air passage). Thus, even when the temperature or atmospheric pressure outside of the substrate 160 has changed, the atmospheric pressure of air in such spaces and the atmospheric pressure outside of the substrate 160 are allowed to be at about the same level. This can reduce stress that would peel or tightly press some of the layers (i.e., the dielectric substrates) forming the substrate 160. Consequently, the long-term reliability of the substrate 160 improves. It should be noted that the conductive via 103b and the conductive via 103d do not overlap in at least one of the first direction and the second direction. Separately providing an air passage of the through-hole 105a and the conductive vias 103a and 103b and an air passage of the through-hole 105c and the conductive vias 103d and 103e can form a transmission path for a high-frequency signal while avoiding other conductor patterns (i.e., planar conductors) that are not illustrated.

The planar conductors 104g, 104h, 104i, and 104j form a microstrip line together with the other planar conductors 104 and the signal lines 102b and 102c. The planar conductors 104g and 104h are provided between the dielectric substrates 101c and 101d, and are provided facing each other with the bonding layer 106c interposed therebetween. The planar conductor 104i is provided between the dielectric substrates 101d and 101g, and is provided facing the planar conductor 104c with the bonding layer 106f interposed therebetween. The planar conductor 104j is provided so as to allow the signal line 102c to be located between the planar conductors 104i and 104j. FIG. 14 illustrates an example in which the planar conductor 104g is provided on the face c2 of the dielectric substrate 101c, the planar conductor 104h is provided on the face d1 of the dielectric substrate 101d, the planar conductor 104i is provided on the face g1 of the dielectric substrate 101g, and the planar conductor 104j is provided on the face h2 of the dielectric substrate 101h. To the planar conductors 104g to 104j, materials, shapes, and surface treatment same as those described with reference to the planar conductor 104a are applicable. It should be noted that the planar conductor 104j may also be referred to as a fifth planar conductor.

The area of each of the planar conductors 104g to 104h is larger than the area of each of the signal lines 102b and 102c. The conductive vias 103d and 103e and the planar conductor 104c are located away from each other and are not electrically connected. The signal line 102b and the planar conductor 104c form a microstrip. Similarly, the signal line 102c and the planar conductor 104i form a microstrip. It should be noted that a conductor pattern (not illustrated) may be added around the signal line 102b or 102c to form a coplanar line or a fin line. In addition, the planar conductors 104g and 104h are located away from the signal line 102b, the conductive via 103b, and the conductive via 103d, and are not electrically connected thereto. The planar conductors 104c and 104i are located away from the conductive vias 103d and 103e and are not electrically connected thereto. Accordingly, the planar conductor 104i, the signal line 102c, and the planar conductor 104j form a strip line. Similarly, the planar conductors 104g and 104h form a strip line together with other planar conductors and signal lines. This can suppress radiation of a high-frequency signal from the signal lines 102b and 102c to the outside of the substrate 160. Consequently, deterioration of transmission properties for high-frequency signals can be reduced.

The through-hole 105c is provided penetrating the dielectric substrate 101h from its face h1 to face h2. To the through-hole 105c, a formation method and a shape same as those described with reference to the through-holes 105 and 105b are applicable.

At least a part of the inner wall of the through-hole 105c, that is, at least a part of a portion of the dielectric substrate 101h with the through-hole 105c is not covered with a conductor. More specifically, a portion of the inner wall of the through-hole 105c within a predetermined distance from the signal line 102c in the second direction is not covered with a conductor. The predetermined distance is determined based on at least one of the diameter of the through-hole 105c, the diameter of the conductive via 103e, the width of the signal line 102c, the material of the bonding layer 106g, and the thickness of the bonding layer 106g in the second direction. Accordingly, the possibility that a high-frequency signal may be propagated to a part of the dielectric substrate 101h can be reduced, and thus, the possibility that the through-hole 105c may act as a stub can be reduced. Consequently, deterioration of transmission properties for high-frequency signals can be reduced. It should be noted that the through-hole 105c may also be referred to as a second through-hole, and the inner wall of the through-hole 105 may also be referred to as a second inner wall.

In the substrate 160, the through-hole 105c is provided penetrating the planar conductor 104j as well. Accordingly, the through-hole 105c behaves like capacitance that cancels out the inductance components of the conductive via 103d and 103e. Consequently, deterioration of transmission properties for high-frequency signals can be reduced.

The bonding layer 106f is provided between the dielectric substrates 101d and 101g, and thus joins the dielectric substrates 101d and 101g. The bonding layer 106g is provided between the dielectric substrates 101g and 101h, and thus joins the dielectric substrates 101g and 101h. The planar conductors 104c and 104i face each other with the bonding layer 106f interposed therebetween. To the bonding layers 106f and 106g, materials same as those described with reference to the bonding layers 106a to 106c are applicable.

The components of the present modified example have been described above. In the substrate 160, the conductive vias 103d and 103e may not be electrically connected due to the presence of the bonding layer 106f, and the conductive via 103e and the signal line 102c may not be electrically connected due to the presence of the bonding layer 106g. In such cases, a DC signal is not propagated. However, a high-frequency signal can be propagated due to capacitance between the conductive vias 103d and 103e and capacitance between the conductive via 103e and the signal line 102c.

In the substrate 160 of the present modified example, a high-frequency signal input to one of the signal lines 102a and 102c is output from the other of the signal lines 102a and 102c via the conductive vias 103a and 103b, the signal line 102b, and the conductive vias 103d and 103e. Separately providing an air passage of the through-hole 105a and the conductive vias 103a and 103b and an air passage of the through-hole 105c and the conductive vias 103d and 103e can form a transmission path for a high-frequency signal while avoiding other conductor patterns (i.e., planar conductors) that are not illustrated. In addition, increasing the number of the dielectric substrates can increase the rigidity of the resulting substrate. Herein, at least one of the planar conductors 101d and 101g to 101i may be omitted. This can reduce the number of the steps of producing the substrate 160, and thus can reduce the production cost.

Described heretofore are the modified examples of the present embodiment. The modified examples of the present embodiment may be applied to the previously described substrates or substrates described below, or the modified examples may be combined unless a contradiction occurs.

The substrate of the present embodiment propagates a high-frequency signal between its internal signal lines 102a and 102b. Since at least a part of the inner wall of the through-hole 105 is not covered with a conductor, the possibility that the through-hole 105 may act as a stub can be reduced, and thus, deterioration of transmission properties for high-frequency signals can be reduced. In addition, since a space in the through-hole 105, a space in the conductive via 103a, and a space in the conductive via 103b are connected, the atmospheric pressure outside of the substrate and the atmospheric pressure of air in such spaces are allowed to be at about the same level. This can reduce stress that would peel or tightly press some of the layers (i.e., the dielectric substrates) forming the substrate. Consequently, the long-term reliability of the substrate improves.

Second Embodiment

Figure 15A:
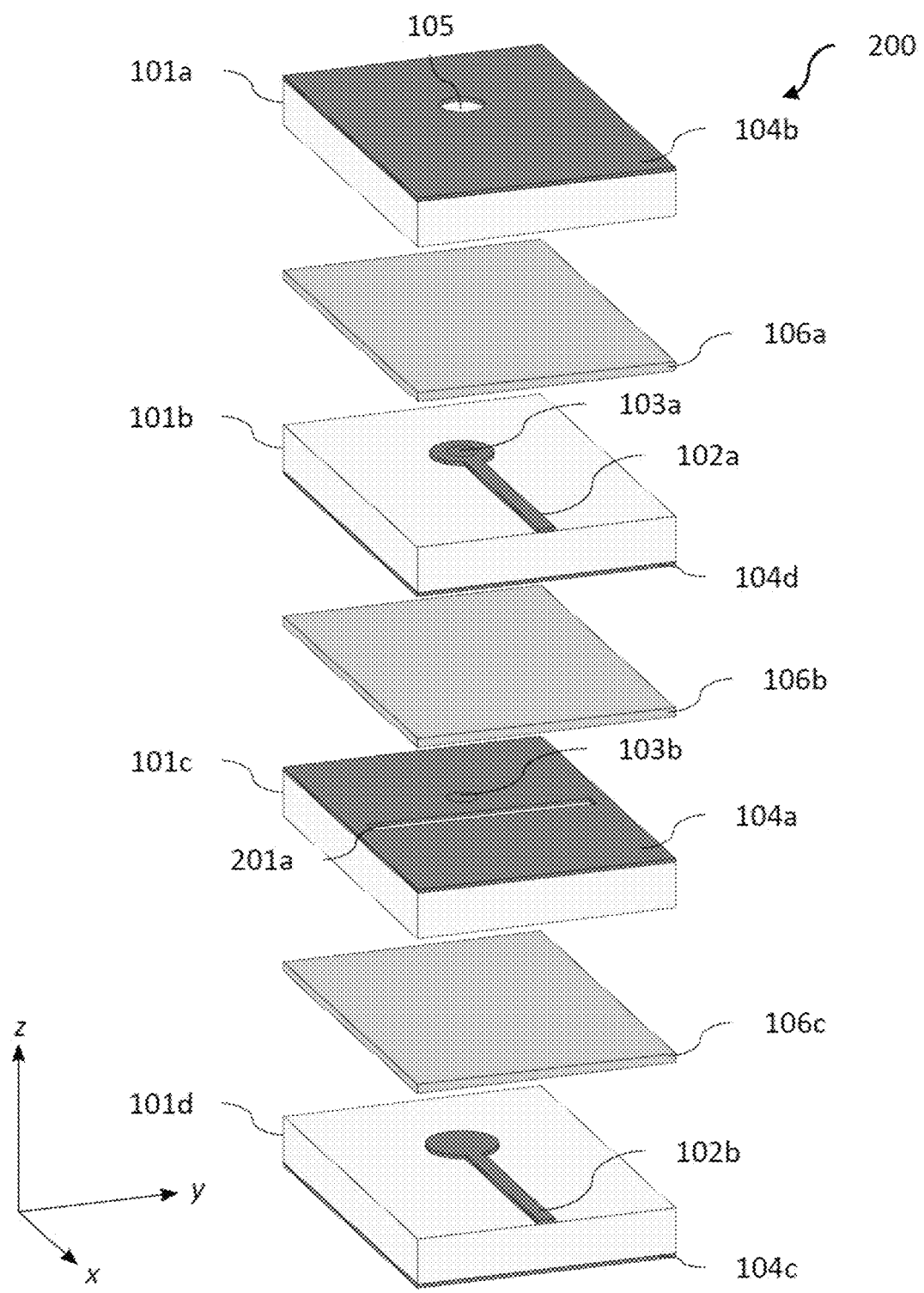
FIG. 15A is a stereoscopic view of a substrate 200 according to a second embodiment.
Figure 15B:
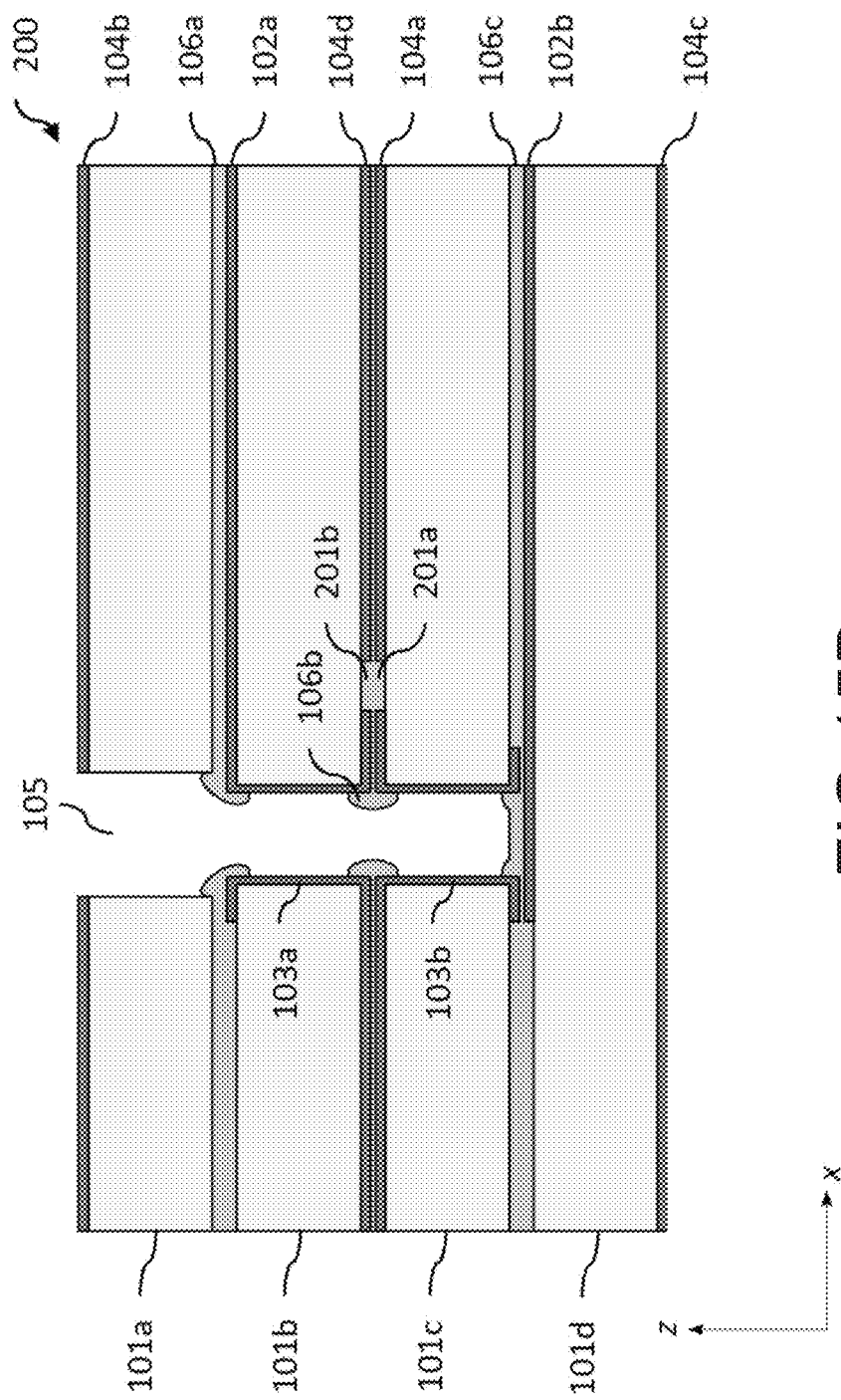
FIG. 15B is an xz cross-sectional view of the substrate 200 according to the second embodiment.

In the first embodiment, propagation of a high-frequency signal between the signal lines 102a and 102b is conducted by the conductive vias 103a and 103b. The propagation of a high-frequency signal may also be conducted using a slot. FIG. 15A is a stereoscopic view of a substrate 200 according to a second embodiment. The substrate 200 includes the same components as the substrate 120. The planar conductor 104a is provided with a slot 201a, and the planar conductor 104d is provided with a slot 201b. In the substrate 200, propagation of a high-frequency signal between the signal lines 102a and 102b is conducted using the conductive vias 103a and 103b and using the slots 201a and 201b. This can improve the transmission coefficient for high-frequency signals. Herein, when the propagation using the conductive vias 103a and 103b and the propagation using the slots 201a and 201b are compared, the propagation using the slots 201a and 201b is dominant. For visibility purposes, FIG. 15A illustrates the substrate 200 before its individual layers are stacked, with gaps provided between the dielectric substrates 101a to 101d. FIG. 15B is an xz cross-sectional view of the substrate 200 after its individual layers are stacked.

The slots 201a and 201b are slots for propagating a high-frequency signal between the signal lines 102a and 102b. Propagation of a high-frequency signal using the slots 201a and 201b is conducted through electromagnetic coupling. The length of each of the slots 201a and 201b is about half the guide wavelength of a high-frequency signal. Each slot may have any shape, and may be a linear slot as illustrated in FIG. 15A and may have at least one vent. Alternatively, each slot may be a partially curved slot, and a plurality of slots may also be provided. The slots 201a and 201b may have either the same shapes or different shapes. It should be noted that when the planar conductor 104d is not provided, a high-frequency signal may be propagated using only the slot 201a.

When a high-frequency signal is propagated using the conductive vias 103a and 103b, there is a possibility that capacitance between the conductive vias 103a and 103b and capacitance between the conductive via 103b and the signal line 102b may become small depending on the thickness of each of the bonding layers 106b and 106c in the first direction. When the signal line 102a is provided on the face a2 of the dielectric substrate 101a, there is a possibility that capacitance between the signal line 102a and the conductive via 103a may become small. Meanwhile, when a high-frequency signal is propagated using the slots 201a and 201b, it is possible to reduce the influence of deterioration of transmission properties for the high-frequency signal due to a decrease in the capacitance because the propagation is conducted through electromagnetic coupling. Consequently, deterioration of transmission properties for high-frequency signals can be reduced, and thus, propagation of a high-frequency signal between the signal lines 102a and 102b can be stabilized.

The components of the substrate 200 have been described above. The present embodiment is only exemplary, and thus can be modified in a variety of ways. For example, the first embodiment as well as the modified examples described in the first embodiment are applicable. Hereinafter, modified examples applicable to the present embodiment will be described.

Modified Example 12

Figure 16:
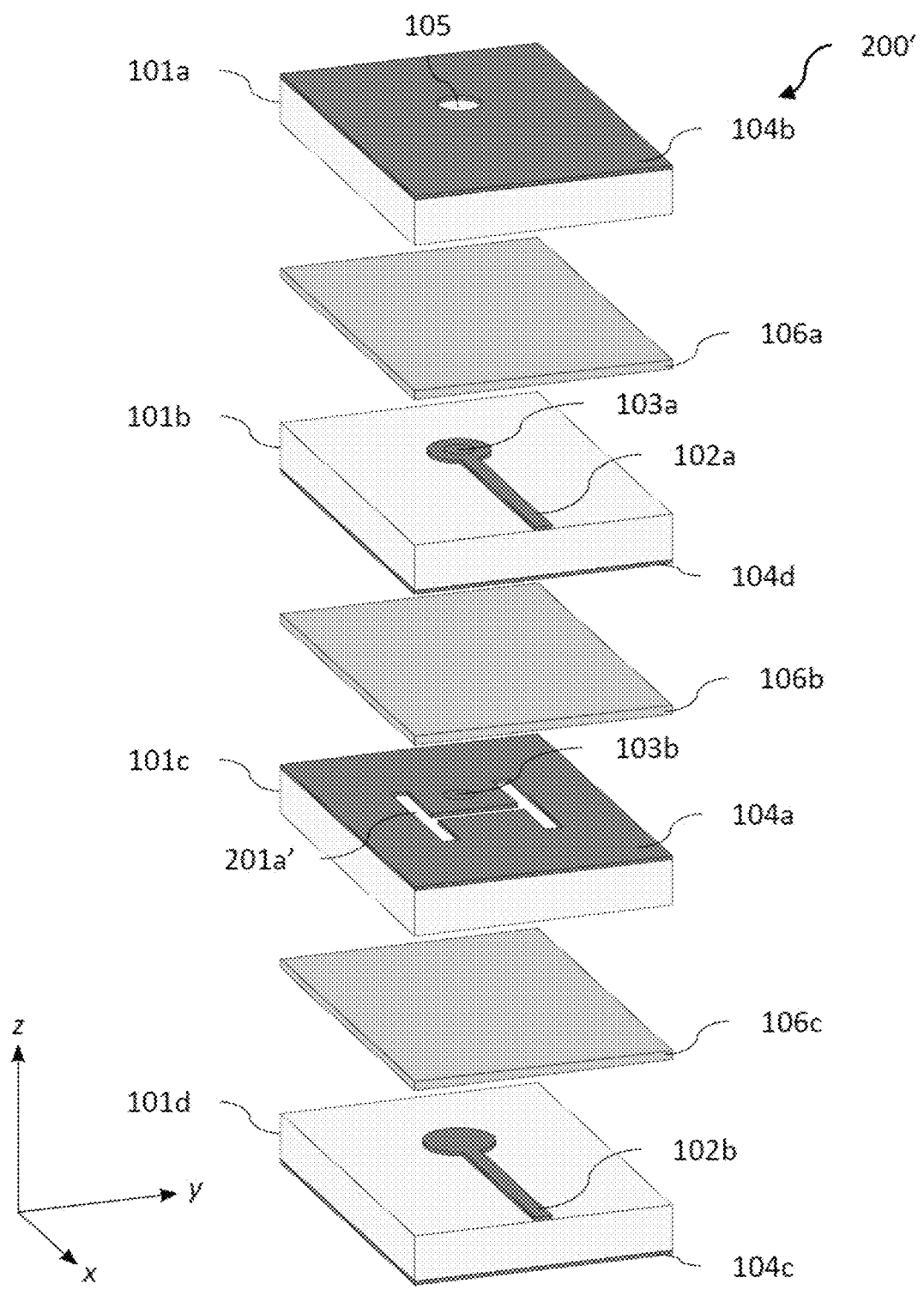
FIG. 16 is an xz cross-sectional view of a substrate 200' applicable to the second embodiment.
Figure 17:
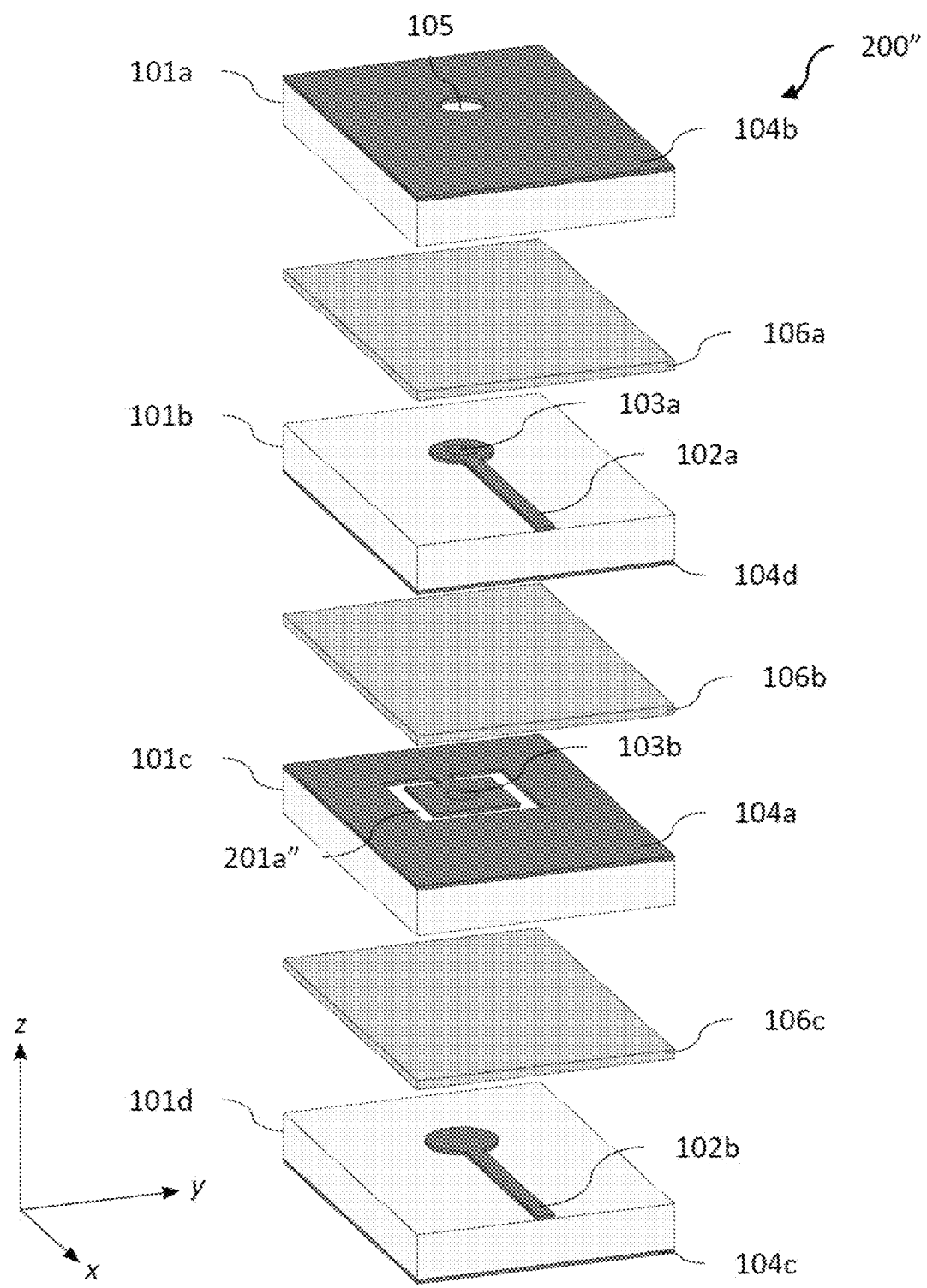
FIG. 17 is an xz cross-sectional view of a substrate 200" applicable to the second embodiment.

A variety of shapes of the slots 201a and 201b are considered. FIG. 16 is an xz cross-sectional view of a substrate 200' after its individual layers are stacked. A slot 201a' of the substrate 200' has an H-shape. A slot 201b' may also have an H-shape. FIG. 17 is an xz cross-sectional view of a substrate 200" after its individual layers are stacked. A slot 201a" of the substrate 200" has a C-shape. A slot 201b" may also have a C-shape. Both the substrates 200' and 200" can propagate a high-frequency signal as with the substrate 200. When the slot 201a has an H-shape or a C-shape, the size of the substrate in the y-direction can be reduced. Consequently, the overall size of the substrate can be reduced, and the cost can thus be reduced.

Modified Example 13

Figure 18A:
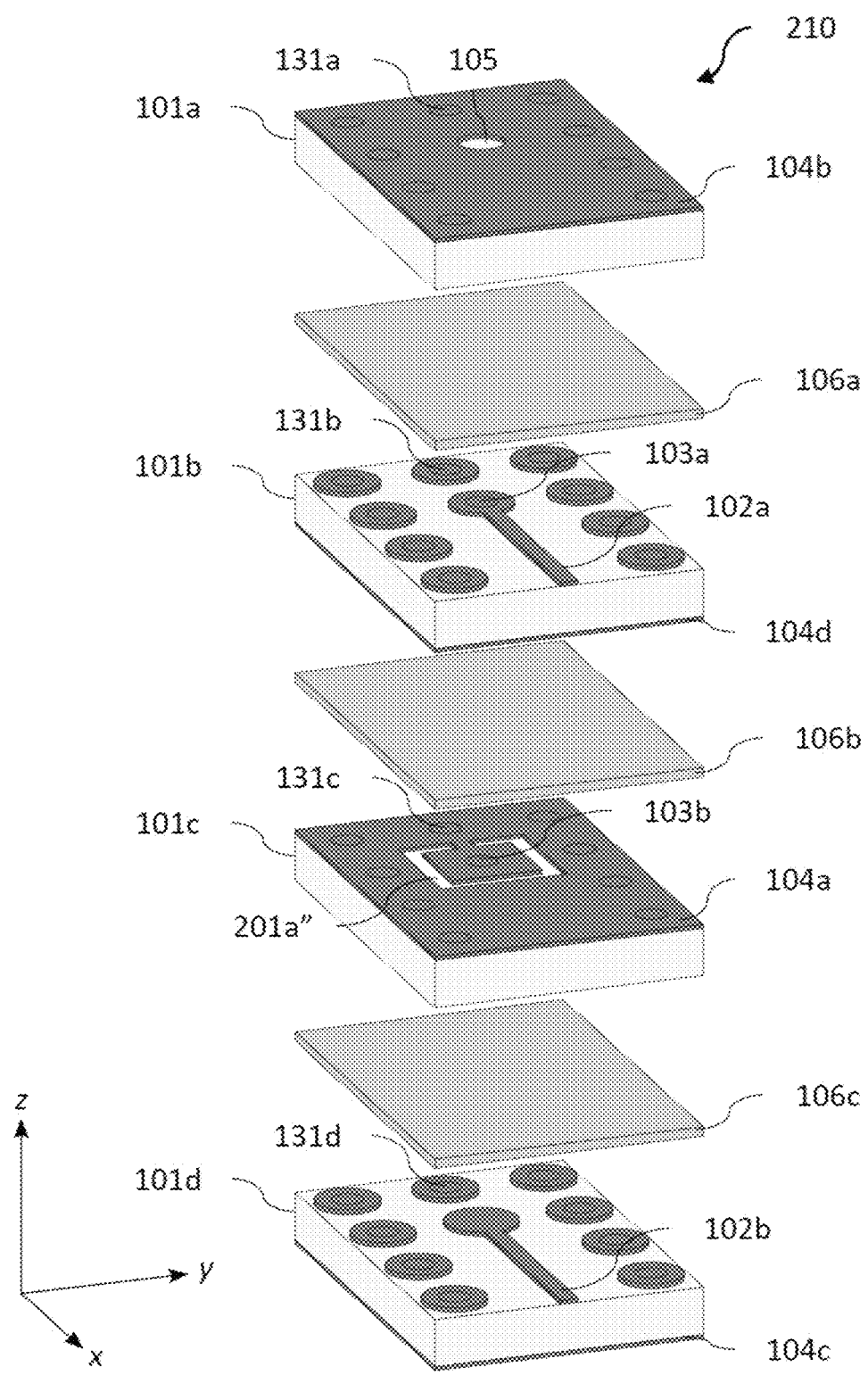
FIG. 18A is a stereoscopic view of a substrate 210 applicable to the second embodiment.
Figure 18B:
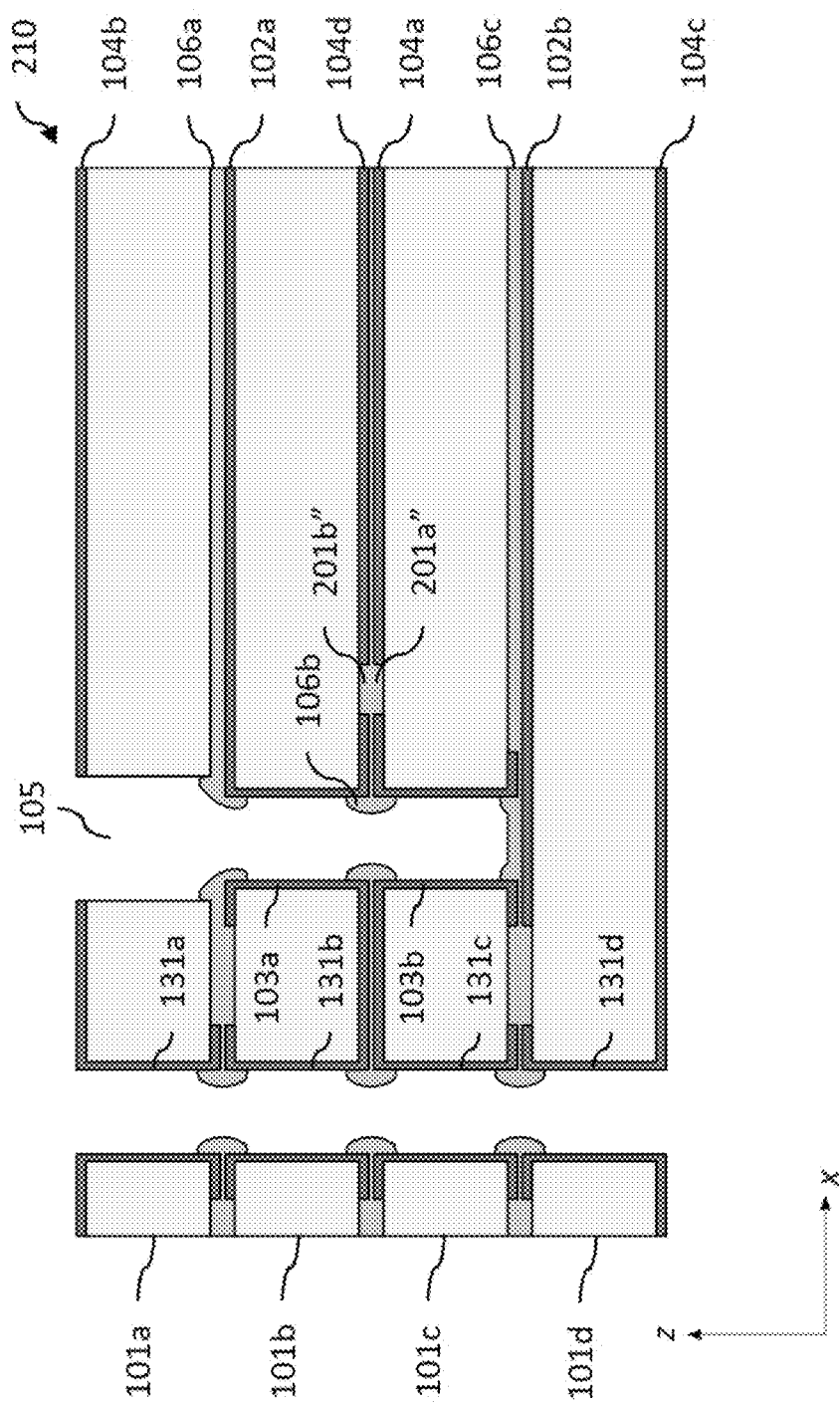
FIG. 18B is an xz cross-sectional view of the substrate 210 applicable to the second embodiment.

The slots described in the present embodiment may be provided in the substrate 130 described in Modified Example 9. FIG. 18A is a stereoscopic view of a substrate 210 according to Modified Example 13. In the substrate 210, the planar conductor 104a of the substrate 130 is provided with the slot 201a" described in Modified Example 12, and the planar conductor 104d is provided with the slot 201b". For visibility purposes, FIG. 18A illustrates the substrate 210 before its individual layers are stacked, with gaps provided between the dielectric substrates 101a to 101d. FIG. 18B is an xz cross-sectional view of the substrate 210 after its individual layers are stacked. The substrate 210 can also propagate a high-frequency signal as with the substrate 200. In addition, the conductive vias 131a, 131b, 131c, and 131d described in Modified Example 9 can reduce leakage of a high-frequency signal due to a parallel plate mode of the signal lines 102a and 102b and the conductive vias 103a and 103b. Consequently, deterioration of transmission properties for high-frequency signals can be reduced.

Figure 19:
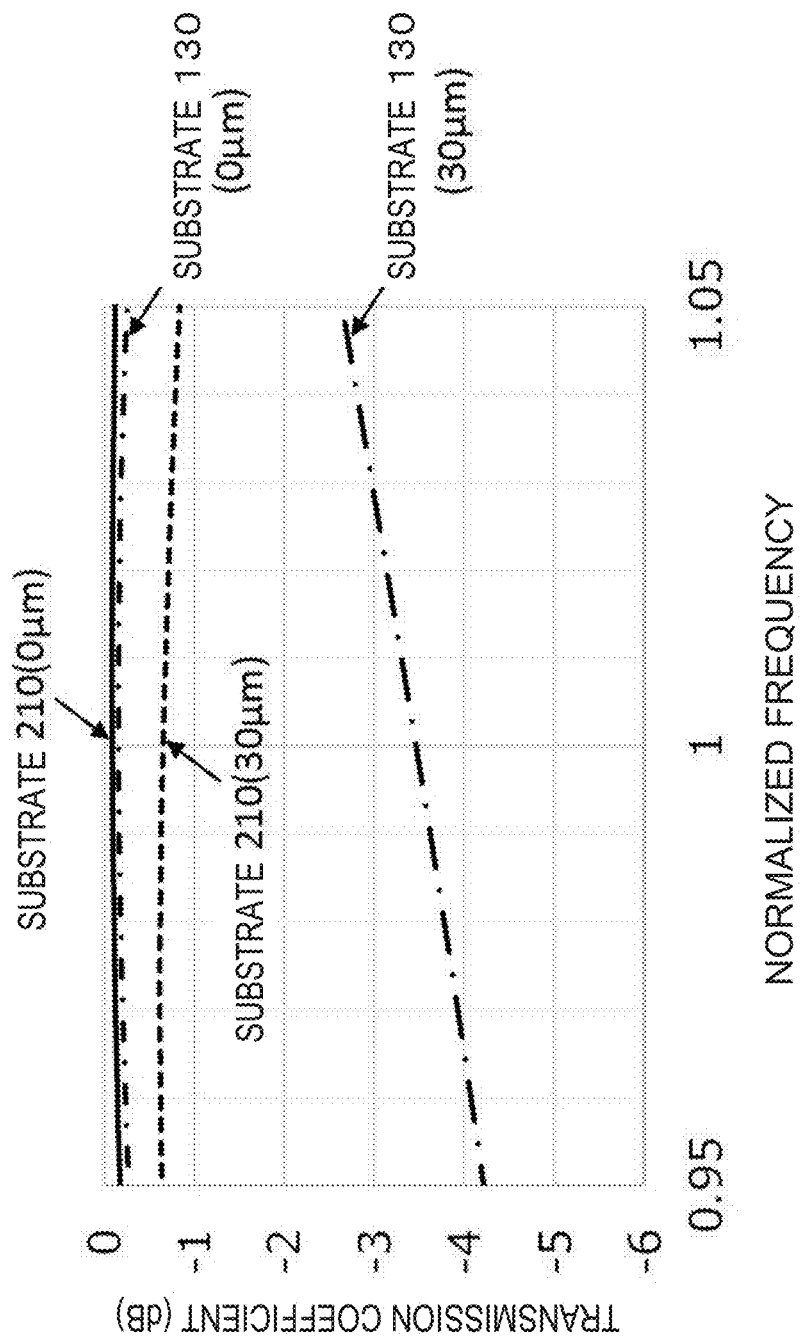
FIG. 19 is a frequency characteristic graph of the transmission coefficients of the substrates 130 and 210 for high-frequency signals.

FIG. 19 represents the frequency characteristics of the transmission coefficients of the substrates 130 and 210 for high-frequency signals. That is, FIG. 19 represents the transmission coefficients for high-frequency signals with respect to the normalized frequency. The graph represents that the greater the numerical value of the transmission coefficient (i.e., the smaller the absolute value thereof), the less the deterioration of the transmission properties for high-frequency signals. The substrate 130 (0 µm) is represented by the alternate long and short dash line, which represents a case where the planar conductors 104a and 104d in the substrate 130 are electrically connected, that is, the bonding layer 106b is not provided. The substrate 130 (30 µm) is represented by the dashed-dotted line, which represents a case where the planar conductors 104a and 104d in the substrate 130 are located away from each other by 30 µm due to the bonding layer 106b interposed therebetween. The substrate 210 (0 µm) is represented by the solid line, which represents a case where the planar conductors 104a and 104d in the substrate 210 are electrically connected, that is, the bonding layer 106h is not provided. The substrate 210 (30 µm) is represented by the dashed line, which represents a case where the planar conductors 104a and 104d in the substrate 210 are located away from each other by 30 µm due to the bonding layer 106b interposed therebetween.

Regarding the case where the planar conductors 104a and 104d are electrically connected (0 µm), the substrate 210 has a higher transmission coefficient than the substrate 130 over a wide frequency range, but there is no big difference between the two substrates.

Regarding the case where the gap between the planar conductors 104a and 104d is 30 µm, the substrate 130, which propagates a high-frequency signal via the conductive vias 103a and 103b, has a transmission coefficient deteriorated by about −2.7 to −4.2 dB at the normalized frequency in the range of 0.95 to 1.05. Meanwhile, the substrate 210, which propagates a high-frequency signal via the slots 201a" and 201b" in addition to the conductive vias 103a and 103b, has suppressed deterioration of a transmission coefficient by about −0.6 to −0.9 dB at the normalized frequency in the range of 0.95 to 1.05.

In the substrate 130 that propagates a high-frequency signal via the conductive vias 103a and 103b, as the gap between the planar conductors 104a and 104d is larger, that is, as the thickness of the bonding layer 106b is greater, capacitance between the conductive vias 103a and 103b becomes smaller. Thus, transmission properties for high-frequency signals deteriorate. Meanwhile, in the substrate 210 that propagates a high-frequency signal via the slots 201a" and 201b" in addition to the conductive vias 103a and 103b, the influence of the gap between the planar conductors 104a and 104d, that is, the thickness of the bonding layer 106b can be suppressed more than in the substrate 210. Accordingly, propagating a high-frequency signal using not only the conductive vias 103 but also the slots 201 can reduce deterioration of transmission properties for high-frequency signals over a wide frequency range.

Described heretofore are the modified examples of the present embodiment. The modified examples of the present embodiment may be applied to the previously described substrates, or the modified examples may be combined unless a contradiction occurs. The substrate of the present embodiment propagates a high-frequency signal between its internal signal lines 102a and 102b. Herein, propagating a high-frequency signal not only via the conductive vias 103a and 103b but also via the slots 201a and 201b can improve transmission properties for high-frequency signals.

Third Embodiment

Figure 20:
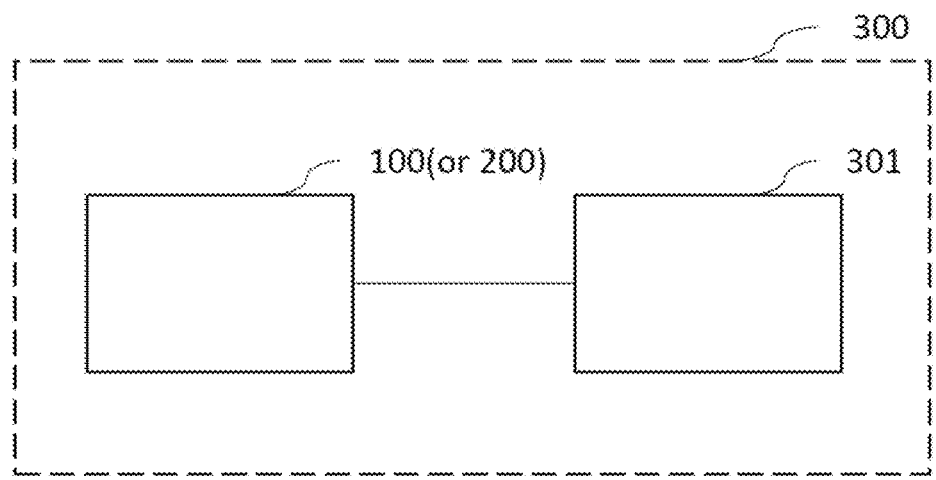
FIG. 20 is a configuration diagram of a high-frequency circuit 300 according to a third embodiment.

FIG. 20 is a configuration diagram of a high-frequency circuit 300 according to a third embodiment. The high-frequency circuit 300 includes the substrate 100 (or 200) and a signal circuit 301 that supplies a high-frequency signal to be propagated through the substrate. The high-frequency circuit 300 may be referred to an electronic circuit 300. Although FIG. 20 represents the substrate 100 (or 200), the substrate 100 (or 200) may be any of the substrates described in the first embodiment, the second embodiment, and the modified examples thereof.

The signal circuit 301 generates a high-frequency signal, and supplies the signal to the substrate 100 (or 200). In the substrate 100 (or 200), the high-frequency signal is received by one of the signal lines 102a and 102b (for example, the signal line 102a), and is propagated to the other signal line (for example, the signal line 102b). In the case of the substrate 160, the high-frequency signal is received by one of the signal lines 102a and 102c, and is propagated to the other signal line. Forming the high-frequency circuit 300 using the substrate 100 (or 200) can reduce deterioration of transmission properties for high-frequency signals, and thus can improve the long-term reliability of the high-frequency circuit 300.

Fourth Embodiment

Figure 21:
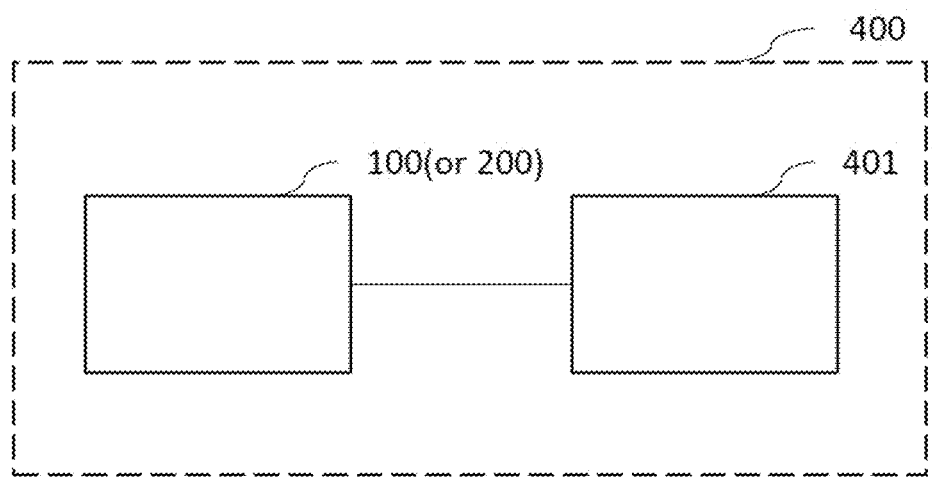
FIG. 21 is a configuration diagram of an antenna apparatus 400 according to a fourth embodiment.

FIG. 21 is a configuration diagram of an antenna apparatus 400 according to a fourth embodiment. The antenna apparatus 400 includes the substrate 100 (or 200) and an antenna element 401 that radiates a high-frequency signal propagated from the substrate.

The antenna element 401 radiates a high-frequency signal propagated from the substrate 100 (or 200) as radio waves. The antenna element 401 receives radio waves, and inputs the radio waves to the substrate 100 (or 200) as a high-frequency signal. The substrate 100 (or 200) outputs a high-frequency signal from one of its signal lines 102a and 102b (for example, the signal line 102a) to the antenna element 401. The substrate 100 (or 200) receives with the one of its signal lines 102a and 102b a high-frequency signal from the antenna element 401 that has received radio waves, and propagates the high-frequency signal to the other signal line (for example, the signal line 102b). In the substrate 160, not the signal lines 102a and 102b but the signal lines 102a and 102c are used.

The antenna element 401 may be provided on the same substrate as the substrate 100 (or 200). Alternatively, the antenna element 401 may be provided on a substrate different from the substrate 100 (or 200) and a high-frequency signal may be propagated through a coaxial cable, for example.

Forming the antenna apparatus 400 using the substrate 100 (or 200) can reduce deterioration of transmission properties for high-frequency signals, and thus can improve the long-term reliability of the antenna apparatus 400.

Fifth Embodiment

Figure 22:
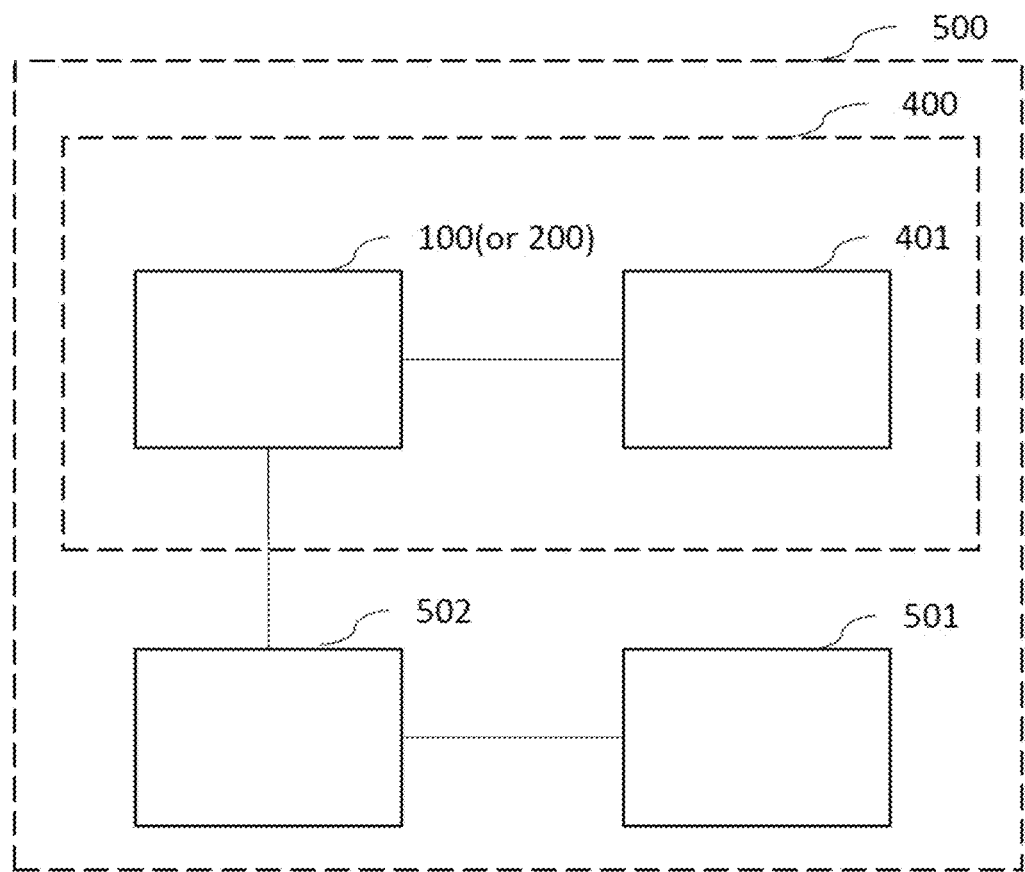
FIG. 22 is a configuration diagram of a wireless communication device 500 according to a fifth embodiment.

FIG. 22 is a configuration diagram of a wireless communication device 500 according to a fifth embodiment. The wireless communication device 500 includes a wireless signal circuit 501 and a converter circuit 502 in addition to the antenna apparatus 400 of the fourth embodiment. The wireless communication device 500 may be referred to an electronic apparatus.

The wireless signal circuit 501 generates a signal for use in wireless communication (hereinafter also referred to as a wireless signal), and sends the signal to the converter circuit 502. In addition, the wireless signal circuit 501 receives a signal demodulated by the converter circuit 502 (hereinafter also referred to as a demodulated signal), and processes the demodulated signal.

The converter circuit 502 modulates the wireless signal sent from the wireless signal circuit 501, and converts the modulated signal into a high-frequency signal, and then sends the high-frequency signal to the antenna apparatus 400. In addition, the converter circuit 502 demodulates a high-frequency signal sent from the antenna apparatus 400, and sends the demodulated signal to the wireless signal circuit 501.

In the substrate 100 (or 200), one of the signal lines 102a and 102b (for example, the signal line 102a) receives a high-frequency signal obtained through conversion from the converter circuit 502, and propagates the high-frequency signal to the other signal line (for example, the signal line 102b). The high-frequency signal is sent to the antenna element 401 from the other signal line, and is radiated as radio waves. When the antenna element 401 has received radio waves, the antenna element 401 sends the radio waves to the other signal line (102b) as a high-frequency signal. In the substrate 100 (or 200), the other signal line (102b) receives the high-frequency signal from the antenna element 401, and propagates the high-frequency signal to the one signal line (102a), and then, the high-frequency signal is sent to the converter circuit 502. In the substrate 160, not the signal lines 102a and 102b but the signal lines 102a and 102c are used.

Forming the wireless communication device 500 using the substrate 100 (or 200) can reduce deterioration of transmission properties for high-frequency signals, and thus can improve the long-term reliability of the wireless communication device 500.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate comprising:
   a first dielectric substrate including a first face, a second face, and a first through-hole penetrating the first dielectric substrate from the first face to the second face;
   a second dielectric substrate including a third face, a fourth face, and a first conductive via penetrating the second dielectric substrate from the third face to the fourth face;
   a first signal line provided between the first dielectric substrate and the second dielectric substrate;
   a third dielectric substrate including a fifth face, a sixth face, and a second conductive via penetrating the third dielectric substrate from the fifth face to the sixth face;

a first planar conductor provided between the second dielectric substrate and the third dielectric substrate, the first planar conductor being located away from the first conductive via and the second conductive via;

a fourth dielectric substrate; and a second signal line provided between the third dielectric substrate and the fourth dielectric substrate, wherein:

at least a part of a first inner wall of the first dielectric substrate at a portion where the first through-hole is provided is not covered with a conductor, the first through-hole and the first conductive via at least partially overlap in a first direction in which at least one of the first conductive via and the second conductive via penetrate, the first conductive via and the second conductive via at least partially overlap in the first direction, and the second conductive via and the second signal line at least partially overlap in the first direction.

2. The substrate according to claim 1, wherein the first inner wall is not covered with the conductor within a first distance from at least one of the first conductive via and the first signal line in the first direction.

3. The substrate according to claim 2, wherein the first distance is determined based on at least one of a diameter of the first through-hole, a diameter of the first conductive via, or a width of the first signal line.

4. The substrate according to claim 1, wherein the first signal line and the second signal lines are signal lines, one of the signal lines being adapted to propagate a high-frequency signal to another signal line.

5. The substrate according to claim 1, further comprising:

a first bonding layer provided between the first dielectric substrate and the second dielectric substrate;

a second bonding layer provided between the second dielectric substrate and the third dielectric substrate; and a third bonding layer provided between the third dielectric substrate and the fourth dielectric substrate.

6. The substrate according to claim 5, wherein:

the first inner wall is not covered with the conductor within a first distance from the first conductive via or the first signal line in the first direction, and the first distance is determined based on at least one of a diameter of the first through-hole, a diameter of the first conductive via, a width of the first signal line, a material of the first bonding layer, or a thickness of the first bonding layer in the first direction.

7. The substrate according to claim 1, further comprising a second planar conductor provided on the first dielectric substrate, wherein the first signal line is provided between the first planar conductor and the second planar conductor.

8. The substrate according to claim 7, wherein:

the first dielectric substrate includes a plurality of third conductive vias, the plurality of third conductive vias penetrating the first dielectric substrate from the first face to the second face and being electrically connected to the second planar conductor, the second dielectric substrate includes a plurality of fourth conductive vias, the plurality of fourth conductive vias penetrating the second dielectric substrate from the third face to the fourth face and being electrically connected to the first planar conductor;

at least one of the plurality of third conductive vias and at least one of the plurality of fourth conductive vias at least partially overlap in the first direction, and a gap between adjacent third conductive vias of the plurality of third conductive vias or between adjacent fourth conductive vias of the plurality of fourth conductive vias is less than or equal to half a guide wavelength of a high-frequency signal.

9. The substrate according to claim 1, further comprising a third planar conductor on the fourth dielectric substrate, wherein the second signal line is provided between the first planar conductor and the third planar conductor.

10. The substrate according to claim 9, wherein:

the third dielectric substrate includes a plurality of fifth conductive vias, the plurality of fifth conductive vias penetrating the third dielectric substrate from the fifth face to the sixth face and being electrically connected to the first planar conductor, the fourth dielectric substrate includes a plurality of sixth conductive vias, the plurality of sixth conductive vias penetrating the fourth dielectric substrate from a seventh face to an eighth face and being electrically connected to the third planar conductor, at least one of the plurality of fifth conductive vias and at least one of the plurality of sixth conductive vias at least partially overlap in the first direction, and a gap between adjacent fifth conductive vias of the plurality of fifth conductive vias or between adjacent sixth conductive vias of the plurality of sixth conductive vias is less than or equal to half a guide wavelength of a high-frequency signal.

11. The substrate according to claim 1, further comprising a fourth planar conductor between the first signal line and the first planar conductor or between the first planar conductor and the second signal line, wherein the fourth planar conductor is located away from the first conductive via and the second conductive via.

12. The substrate according to claim 1, wherein:

the fourth dielectric substrate includes a seventh conductive via penetrating the fourth dielectric substrate from a seventh face to an eighth face, the substrate further comprises:

a fifth dielectric substrate including a ninth face, a tenth face, and an eighth conductive via penetrating the fifth dielectric substrate from the ninth face to the tenth face;

a third planar conductor provided between the fourth dielectric substrate and the fifth dielectric substrate, the third planar conductor being located away from the seventh conductive via and the eighth conductive via;

a sixth dielectric substrate including an eleventh face, a twelfth face, and a second through-hole penetrating the sixth dielectric substrate from the eleventh face to the twelfth face; and a third signal line provided between the fifth dielectric substrate and the sixth dielectric substrate, at least a part of a second inner wall of the sixth dielectric substrate at a portion where the second through-hole is provided is not covered with a conductor, the second through-hole and the eighth conductive via at least partially overlap in a second direction in which at least one of the seventh conductive via and the eighth conductive via penetrate, the seventh conductive via and the eighth conductive via at least partially overlap in the second direction, and the second conductive via and the seventh conductive via do not overlap in at least one of the first direction and the second direction.

13. The substrate according to claim 12, wherein the second inner wall is not covered with the conductor within a second distance from the eighth conductive via or the third signal line in the second direction.

14. The substrate according to claim 13, wherein the second distance is determined based on at least one of a diameter of the second through-hole, a diameter of the eighth conductive via, or a width of the third signal line.

15. The substrate according to claim 1, further comprising a fifth planar conductor on the sixth dielectric substrate, wherein the third signal line is provided between the third planar conductor and the fifth planar conductor.

16. The substrate according to claim 1, wherein the first planar conductor includes a slot, the slot being adapted to propagate a high-frequency signal between the first signal line and the second signal line.

17. An electronic circuit comprising:
the substrate according to claim 1; and
a signal circuit configured to supply a high-frequency signal to be propagated to the first signal line or the second signal line.

18. An antenna apparatus comprising:
the substrate according to claim 1; and
an antenna element configured to radiate a high-frequency signal propagated from the first signal line or the second signal line.

19. An electronic apparatus comprising:
the antenna apparatus according to claim 18;
a wireless signal generator configured to generate a wireless signal for use in wireless communication; and
a converter configured to convert the wireless signal into a high-frequency signal and supply the high-frequency signal to the first signal line or the second signal line.

20. A method for producing a substrate, comprising stacking:
a first dielectric substrate including a first face, a second face, and a first through-hole penetrating the first dielectric substrate from the first face to the second face,
a second dielectric substrate including a third face, a fourth face, and a first conductive via penetrating the second dielectric substrate from the third face to the fourth face,
a first signal line provided between the first dielectric substrate and the second dielectric substrate,
a third dielectric substrate including a fifth face, a sixth face, and a second conductive via penetrating the third dielectric substrate from the fifth face to the sixth face,
a first planar conductor provided between the second dielectric substrate and the third dielectric substrate, the first planar conductor being located away from the first conductive via and the second conductive via,
a fourth dielectric substrate, and
a second signal line provided between the third dielectric substrate and the fourth dielectric substrate, wherein:

at least a part of a first inner wall of the first dielectric substrate at a portion where the first through-hole is provided is not covered with a conductor, the first through-hole and the first conductive via at least partially overlap in a first direction in which at least one of the first conductive via or the second conductive via penetrate, the first conductive via and the second conductive via at least partially overlap in the first direction, and the second conductive via and the second signal line at least partially overlap in the first direction.

\* \* \* \* \*